United States Patent
Melanson et al.

(10) Patent No.: US 11,777,495 B2
(45) Date of Patent: *Oct. 3, 2023

(54) DRIVER CIRCUITRY AND OPERATION

(71) Applicant: Cirrus Logic International Semiconductor Ltd., Edinburgh (GB)

(72) Inventors: John L. Melanson, Austin, TX (US);
Eric J. King, Austin, TX (US);
Thomas H. Hoff, Austin, TX (US);
Axel Thomsen, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/740,468

(22) Filed: May 10, 2022

(65) Prior Publication Data

US 2022/0271748 A1 Aug. 25, 2022

Related U.S. Application Data

(63) Continuation of application No. 17/349,536, filed on Jun. 16, 2021, now Pat. No. 11,368,151, which is a
(Continued)

(51) Int. Cl.
*H03K 17/687* (2006.01)
*H02N 2/00* (2006.01)
*H02M 3/158* (2006.01)

(52) U.S. Cl.
CPC ........ *H03K 17/6871* (2013.01); *H02M 3/158* (2013.01); *H02N 2/0075* (2013.01)

(58) Field of Classification Search
CPC .. H03K 17/6871; H02M 3/158; H02N 2/0075
See application file for complete search history.

(56) References Cited

U.S. PATENT DOCUMENTS

| 4,725,993 A | 2/1988 | Owen et al. |
| 6,353,354 B1 | 3/2002 | Detweiler et al. |

(Continued)

FOREIGN PATENT DOCUMENTS

| CN | 205725503 U | 11/2016 |
| GB | 2446843 A | 8/2008 |
| WO | 2017127132 A1 | 7/2017 |

OTHER PUBLICATIONS

International Search Report and Written Opinion of the International Searching Authority, International Application No. PCT/GB2021/051967, dated Oct. 7, 2021.
(Continued)

*Primary Examiner* — Metasebia T Retebo
(74) *Attorney, Agent, or Firm* — Jackson Walker L.L.P

(57) ABSTRACT

This application relates to methods and apparatus for driving a transducer with switching drivers where the switching driver has an output bridge stage for switching an output node between switching voltages and a modulator for controlling the duty cycle of the output bridge stage based on an input signal. The switching driver also includes a voltage controller for providing the switching voltages which is operable to provide different switching voltages in different driver modes. A controller is provided to control the driver mode of operation and the duty cycle of the switching driver based on the input signal, and the controller is configured to transition from a present driver mode to a new driver mode by controlling the voltage controller to provide the switching voltages for the new mode and controlling the modulator to vary the duty cycle of the output bridge stage. The change in duty cycle is controlled such that there is no substantial discontinuity in switching ripple due to the mode transition.

17 Claims, 10 Drawing Sheets

Related U.S. Application Data continuation of application No. 17/314,917, filed on May 7, 2021, now Pat. No. 11,277,129.

(60) Provisional application No. 63/065,051, filed on Aug. 13, 2020.

(56) References Cited

U.S. PATENT DOCUMENTS

| | | |
|---|---|---|
| 7,518,442 B1 | 4/2009 | Dijkstra et al. |
| 7,772,924 B2 | 8/2010 | Matamura |
| 8,008,969 B1 | 8/2011 | Forejt et al. |
| 9,515,617 B2 | 12/2016 | Hoyerby |
| 9,793,867 B2 | 10/2017 | Frith et al. |
| 9,806,684 B2 | 10/2017 | Frith et al. |
| 9,973,157 B2 | 5/2018 | Frith et al. |
| 10,447,152 B2 | 10/2019 | Zhang et al. |
| 11,277,129 B2 | 3/2022 | Thomsen et al. |
| 11,368,151 B2 * | 6/2022 | Melanson .......... H03K 17/6871 |
| 2010/0090764 A1 | 4/2010 | Buter et al. |
| 2010/0231298 A1 | 9/2010 | Norimatsu et al. |
| 2013/0223651 A1 | 8/2013 | Hoyerby |
| 2014/0056442 A1 | 2/2014 | Anazawa |
| 2014/0233763 A1 | 8/2014 | Atkins et al. |
| 2018/0019666 A1 | 1/2018 | Zhang et al. |
| 2018/0331660 A1 * | 11/2018 | Høyerby ............... H03F 3/2171 |
| 2018/0351478 A1 | 12/2018 | King et al. |
| 2019/0356287 A1 * | 11/2019 | Lesso .................... H03F 3/2173 |
| 2021/0184663 A1 | 6/2021 | Xia et al. |
| 2022/0048069 A1 | 2/2022 | Thomsen et al. |
| 2022/0052686 A1 | 2/2022 | Thomsen et al. |
| 2022/0052687 A1 | 2/2022 | Melanson et al. |
| 2022/0053267 A1 | 2/2022 | Doy et al. |

OTHER PUBLICATIONS

Vanhalakka, Juha, "Power Supply for Piezoelectric Actuator Thesis submitted for examination for the degree of Master", Science in Technology EspooSc. (Tech.) Jari Kostamo, May 26, 2014.

International Search Report and Written Opinion of the International Searching Authority, International Application No. PCT/GB2021/052063, dated Nov. 29, 2021.

Combined Search and Examination Report under Sections 17 and 18(3), UKIPO, Application No. GB2109569.0, dated Oct. 21, 2021.

International Search Report and Written Opinion of the International Searching Authority, International Application No. PCT/GB2022/051964, dated Mar. 20, 2023.

* cited by examiner

|  | Switch and State | Source/bulk Voltage | Drain Voltage | N-Well Voltage |
|---|---|---|---|---|
| Mode 1 0V to +VSUP | SW1A ON | +VSUP | +VSUP | +VSUP |
|  | SW1B OFF | 0V | +VSUP | +VSUP |
|  | SW1C ON | +VSUP | +VSUP | +VSUP |
|  | SWO1 DC | 0V/+VSUP | +VSUP | +VSUP |
|  | SWO2 DC | 0V | 0V / +VSUP | 0V |
|  | SW2A OFF | 0V | +VSUP | 0V |
|  | SW2B ON | 0V | 0V | 0V |
|  | SW2C ON | 0V | 0V | 0V |
| Mode 2 +VSUP to +2VSUP | SW1A ON | + VSUP | +VSUP | +VSUP |
|  | SW1B OFF | 0V | +VSUP | +VSUP |
|  | SW1C OFF | +VSUP | +2VSUP | +2VSUP |
|  | SWO1 DC | +VSUP /+2VSUP | +2VSUP | +2VSUP |
|  | SWO2 DC | +VSUP | +VSUP/+2VSUP | +VSUP |
|  | SW2A ON | +VSUP | +VSUP | +VSUP |
|  | SW2B OFF | 0V | +VSUP | +VSUP |
|  | SW2C ON | +VSUP | +VSUP | +VSUP |
| Mode 3 -VSUP to 0V | SW1A OFF | 0V | +VSUP | +VSUP |
|  | SW1B ON | 0V | 0V | 0V |
|  | SW1C ON | 0V | 0V | 0V |
|  | SWO1 DC | -VSUP/0V | 0V | 0V |
|  | SWO2 DC | -VSUP | -VSUP/0V | 0V |
|  | SW2A OFF | 0V | +VSUP | +VSUP |
|  | SW2B ON | 0V | 0V | +VSUP |
|  | SW2C OFF | -VSUP | 0V | 0V |

Figure 8

DRIVER CIRCUITRY AND OPERATION

RELATED APPLICATIONS

The present disclosure is a continuation of U.S. Non-Provisional patent application Ser. No. 17/349,536, filed Jun. 16, 2021, which is a continuation of U.S. Non-Provisional patent application Ser. No. 17/314,917, filed May 7, 2021, which claims priority to U.S. Provisional Patent Application Ser. No. 63/065,051, filed Aug. 13, 2020, each of which is incorporated by reference herein in its entirety.

FIELD OF DISCLOSURE

The field of representative embodiments of this disclosure relates to methods, apparatus and/or implementations concerning or relating to driver circuits, and in particular to switching driver circuits as may be used to drive a transducer.

BACKGROUND

Many electronic devices include transducer driver circuitry for driving a transducer with a suitable driving signal, for instance for driving an audio output transducer of the host device or a connected accessory, with an audio driving signal.

FIG. 1 is a schematic illustration of circuitry for driving a transducer. As shown generally at 100 in FIG. 1, a driver 102 may receive an input signal Sin and generate a corresponding drive signal for driving the transducer. The input signal Sin may, for example, be an input audio or ultrasonic signal or haptic waveform or the like and may be received from upstream circuitry (not shown) such as upstream amplification and/or signal processing circuitry. The driver 102 drives the transducer 104 with the drive signal based on the input signal Sin. Where the transducer is an output transducer the driver 102 drives the transducer 104 to cause the transducer to produce a desired output, e.g. an audible, ultrasonic or haptic output based on the input signal Sin.

In some applications the driver 102 may include a switching amplifier stage, e.g. a class-D amplifier stage or the like, for generating the drive signal. Switching amplifier stages can be relatively power efficient and thus can be advantageously used in some applications. A switching amplifier stage generally operates to switch an output node between defined high and low switching voltages, with a duty cycle that provides a desired average output voltage over the course of the duty cycle for the drive signal. To provide a desired output voltage range, the switching amplitude may be switched between the peak high and low voltages of the desired output range, for instance between a high-side voltage VH and ground.

FIG. 1 illustrates an example of a single-ended driver, but it will be understood that in some implementations a transducer may be driven in a bridge-tied-load configuration.

FIG. 2 illustrates an example of driver circuitry 200 for driving a bridge-tied-load (BTL).

FIG. 2 illustrates that each side of the transducer 104 is connected to a respective driver 102-1 and 102-2. The output node 201 of each driver 102-1 and 102-2 is switched between a high-side voltage VH and a low-side voltage VL, for example between a positive supply voltage and ground, with controlled duty cycles so as to control the voltage across the transducer 104. FIG. 2 illustrates that each of the drivers 102-1 and 102-2 comprise switches 202a and 202b, which may be typically implemented as MOSFETs, for selectively connecting the output node 201 of the driver to the high-side voltage or the low-side voltage. Modulators 203-1 and 203-2 control the duty-cycle of the switching of the switches 202a and 202b of the respective driver 102-1 and 102-2 based on the input signal. The modulators 105 may generate PWM or PDM switching signals based on the input signal as will be understood by one skilled in the art. The drivers 102-1 and 102-2 can thus be seen as generating respective first and second drive signals which are components of a differential driving signal for driving the load.

In at least some applications, for example for driving some piezoelectric transducers, it may be desirable to generate drive signals with relatively high amplitudes, for example with a peak-to-peak voltage range of the order of tens of volts or so. This may therefore typically require the input voltage for the driver 102, i.e. the voltage difference between VH and VL, to be relatively high to provide the required output range.

For instance, piezoelectric or piezo transducers or ceramic transducers are increasingly being proposed for use in some applications, for instance for audio, ultrasonic or haptics output, and may be considered as an alternative to conventional cone and voice-coil type speaker or resonant actuators or the like. Piezoelectric transducers may be advantageous in some applications, especially for portable electronics devices such as mobile telephones, laptop and tablet computers and the like, due to their thin form factor, which may be beneficial in meeting the demand for increasing functionality in such devices without significantly increasing their size. Piezoelectric transducers are also increasingly finding application as transducers for ultrasonic and range-finding systems.

Piezoelectric transducers may also be used as input transducers or sensors in some applications.

Using such high input voltages can, however, result in relatively large voltages stresses across the switches of the driver, which may require the use of devices with high voltage tolerances, which may not be practical for some applications, or which may add to the cost of the circuitry.

Using such high input voltages as the switching voltages for the switching drivers may also, in some implementations, require the use of components such as inductors with a relatively high inductance so as to avoid large ripple current due to the switching, which may be disadvantageous in some implementations.

SUMMARY

Embodiments of the present disclosure relate to improved driving circuits.

According to an aspect of the disclosure there is provided a driver apparatus for driving a transducer comprising a first switching driver having a first driver output node for driving the transducer. The first switching driver comprises a first output bridge stage for selectively switching the first driver output node between high and low switching voltages, a first modulator for controlling a duty cycle of switching of the first output bridge stage based on an input signal; and a first voltage controller for providing said switching voltages. The first switching driver is operable in a plurality of driver modes of operation in which the first voltage controller is operable to provide different switching voltages in each driver mode. The apparatus also comprises a controller for controlling the driver mode of operation and the duty cycle of the first switching driver based on the input signal, wherein the controller is configured to transition between said driver modes of operation from a present mode to a new mode by: controlling the first voltage controller to provide the switching voltages for the new mode; and controlling the first modulator to vary the duty cycle of the first output bridge stage, wherein the change in duty cycle is controlled such that there is no substantial discontinuity in switching ripple.

In some examples, the driver apparatus may also comprise a second switching driver having a second driver output node for driving the transducer in a bridge-tied load configuration with the first switching driver. The second switching driver may comprise a second output bridge stage for selectively switching the second driver output node between respective high and low switching voltages and a second modulator for controlling a duty cycle of switching of the second output bridge stage based on the input signal. The controller may be configured, on a transition in mode of operation of the first switching driver from the present mode to the new mode, to operate the second switching driver with no change to the switching voltages for the second output bridge stage and to control the second modulator to vary the duty cycle of the second output bridge stage such that a differential voltage across the transducer over the course of a switching cycle is substantially the same before and after the transition. On such a transition of the first switching driver from the present mode to the new mode, the controller may be configured to control the first modulator to vary the duty cycle of the first output bridge stage by a first duty cycle amount and to vary the duty cycle of the second output bridge stage by a second duty cycle amount, wherein the magnitude of the first duty cycle amount added to the magnitude of the second duty cycle amount corresponds to a duty cycle of 100%.

The controller may be configured to operate the first switching driver in a selected driver operating mode with a duty cycle for the first output bridge stage within predetermined maximum and minimum limits of duty cycle. The controller may be configured to transition from the present mode to the new mode when the relevant duty cycle limit is reached. The controller may be configured to, when the relevant maximum or minimum duty cycle limit is reached for the present mode of operation, to transition to the new mode of operation and to control the first modulator to operate at the minimum or maximum duty cycle limit respectively in the new mode of operation. In some examples the maximum duty cycle limit may be 75%. In some examples, the minimum duty cycle limit may be 25%.

In some implementations, the controller may be configured to control the first and second switching drivers such that there is no substantial change in ramp direction in load current from the first driver output node at the point in time in which the first voltage controller varies the switching voltages to the switching voltages corresponding to the new mode.

Each of the first and second modulators may compare a modulator input, based on the input signal, with a carrier waveform to control the duty cycle of the respective output stage. The controller may be configured, on a change in operating mode of the first switching driver, to vary an amount of a mode correction applied to the modulator input by an amount related to the switching voltages of the new operating mode. In some examples, on a transition of the first switching driver from the present mode to the new node, the controller may be configured to apply a phase shift to the carrier waveform. The phase shift applied to the carrier waveform may be based on the amount of change in duty cycle for the second switching driver. In some cases the carrier waveform may be a triangle waveform that ramps from a minimum value to a maximum value and back to the minimum value over the course of a cycle period. In such a case, the controller may be configured such that the phase shift applied to the carrier waveform is a proportion of the cycle period that corresponds to half the change in duty cycle for the second switching driver.

In some implementations, the second switching driver may comprise a second voltage controller for providing the switching voltages for the second output bridge stage and the second switching driver may also be operable in a plurality of driver modes of operation in which the second voltage provides different switching voltages in each driver mode. The controller may also control the driver mode of operation of the second switching driver based on the input signal. The controller may be configured to transition between the driver modes of operation of the second switching driver from a present mode and a new mode by: controlling the second voltage controller to provide the switching voltages for the new mode; controlling the second modulator to vary the duty cycle of the second output bridge stage; and operating the first switching driver with no change to the switching voltages for the first switching driver and controlling the first modulator to vary the duty cycle of the first output stage such that a differential voltage across the transducer over the course of a switching cycle is substantially the same before and after the transition.

In some implementations, the first switching driver may be configured to drive one side of the transducer in a single-ended configuration with an opposite side of the transducer connected to a DC voltage. In such a case, the controller may be configured, on a transition in driver mode of operation of the first switching driver from the present mode to the new mode, to controllably vary the value of the DC voltage such that a differential voltage across the load over the course of a switching cycle is substantially the same before and after the transition.

In some implementations, the driver apparatus may further comprise at least a first inductor connected to the first driver output node for connection in series with the transducer.

In some examples, the transducer may be at least one of: an audio output transducer; a haptic output transducer; a piezoelectric transducer; and a ceramic transducer.

Aspects also relate to an electronic device comprising the driver apparatus of any of the embodiments described herein.

In another aspect there is provided a driver apparatus comprising a first switching output stage for switching a first driver output node between a set of switching voltages with a controlled duty cycle wherein the driver apparatus is operable in at least first and second modes of operation. In the first mode of operation the set of switching voltages comprise a first voltage and a second voltage, and in the second mode of operation the set of switching voltages comprise the second voltage and a third voltage. The driver apparatus further comprises a controller for controlling the mode of operation of the driver apparatus and the duty cycle of the first switching output stage based on an input signal. The controller is configured to transition between the first and second mode of operations from a present mode to a new mode by: controlling the driver apparatus in the present mode with a first duty cycle, controllably varying the set of switching voltages to the relevant voltages for the new mode of operation; and controllably varying the duty cycle of the first switching output stage, wherein the change in duty cycle is controlled such that there is substantially no discontinuity in switching ripple.

In a further aspect there is provided a driver apparatus for driving a transducer in a bridge-tied-load configuration between first and second driver output nodes with a differential drive signal based on an input signal. The driver apparatus comprises a first switching driver for switching the first driver output node between a first set of switching voltages and a second switching driver for switching the second driver output node between a second set of switching voltages. At least the first switching driver is operable in different driver modes in which the first set of switching voltages is different in the different driver modes. A controller is configured to control a duty cycle of the first switching driver and a duty cycle of the second switching driver by comparing a carrier signal with at least one modulator input signal that varies with the input signal. On a change of driver mode of the first switching driver, the controller is configured to adjust an offset applied to at least one modulator input signal and also apply a phase shift to the carrier waveform.

In a further aspect there is provided a switching driver for driving a transducer comprising: first and second supply nodes for connection to first and second voltage supplies defining an input voltage; an output bridge stage comprising a first output switch connected between a first switching voltage node and an output node and a second output switch connected between a second switching voltage node and the output node; a capacitor; and a network of switches connecting said first and second supply nodes with said first and second switching voltage nodes and said capacitor. The network of switches may be operable in different switch states to provide different voltages at the first and second switching voltage nodes. The switch states may comprise a first switch state in which the capacitor is connected between the first and second supply nodes to be charged to the input voltage and the first and second switching voltage nodes are coupled to the first and second supply nodes respectively; and a second switch state in which the second switching voltage node is connected to a voltage different to that at the second supply node and the capacitor is connected between the second switching voltage node and the first switching voltage node to provide a boosted voltage at the first switching node. The driver may also comprise a controller configured to control the switch state of the network of switches and a duty cycle of the first and second output switches of the output bridge stage based on an input signal to generate an output signal at the output node for driving the transducer.

In another aspect there is provided a switching driver for driving a transducer based on an input signal comprising: first and second supply nodes for connection to first and second voltage supplies defining an input voltage; an output bridge stage comprising a first output switch connected between a first switching voltage node and an output node and a second output switch connected between a second switching voltage node and the output node; a capacitor connected between said first and second switching voltage nodes in parallel with the output bridge stage; and a network of switches connecting said first and second supply nodes with said first and second switching voltage nodes, the network of switches being operable in different switch states. In a first switch, the first and second switching voltage nodes may be coupled to the first and second supply nodes respectively and the capacitor is charged to the input voltage. In a second switch state, the second switching voltage node may be connected to a voltage different to that at the second supply node and the capacitor is connected between the second switching voltage node and the first switching voltage node to provide a boosted voltage at the first switching node.

An aspect also relates to a switching driver for driving a transducer comprising: first and second supply nodes for connection to first and second voltage supplies defining an input voltage; an output bridge stage for selectively connecting an output node to first or second switching voltage nodes with a controlled duty cycle; a capacitor connected between said first and second switching voltage nodes in parallel with the output bridge stage; and a network of switches connecting said first and second supply nodes with said first and second switching voltage nodes, wherein the network of switches is operable such that a first electrode of said capacitor can be selectively connected to either of the first and second supply nodes.

In a further aspect, there is provided a driver circuit for driving a transducer based on an input signal comprising: first and second switching drivers with respective driver output nodes for driving said transducer in a bridge-tied-load configuration, each of the first and second switching drivers comprising a respective output stage for controllably switching the respective driver output node between high and low switching voltages with a controlled duty cycle. Each of the first and second switching drivers is operable in a plurality of different driver modes, wherein the switching voltages are different in said different driver modes; and a controller controls the driver mode of operation and the duty cycle of each of the first and second switching drivers based on the input signal. The controller is configured to control the duty cycles of the first and second switching drivers within defined minimum and maximum limits of duty cycles. The controller is configured to transition between different driver modes of operation when the duty cycle of at least one of the first and second switching drivers reaches the maximum or minimum duty cycle limit and the controller is configured to implement the transition by changing the driver mode of one of the first and second switching drivers at said maximum or minimum limit of duty cycle and vary the duty cycle of that one of the first and second switching drivers to the other limit of duty cycle whilst maintaining the driver mode of the other of the first and second switching drivers and applying a variation in duty cycle to maintain a magnitude of a differential component of the first and second driver signal.

In a further aspect, there is provided a driver circuit for driving a transducer based on an input signal comprising: first and second switching drivers configured to drive the transducer in a bridge-tied-load configuration; wherein each of the first and second switching drivers comprise an output stage for controllably switching a driver output node two switching voltages with a controlled duty cycle and wherein each of the first and second switching drivers is operable in a plurality of different driver modes where the switching voltages are different in the different driver modes. A controller may control the driver mode of operation and duty cycle of each of the first and second switching drivers based on the input signal, wherein the controller is configured to controllably vary the duty cycle within a minimum duty cycle limit greater than 0% and a maximum duty cycle limit less than 100% and to transition between driver modes when one of the minimum or maximum duty cycle limits is reached. The controller may be configured such that during any mode transition, the driver mode of just one of the first and second switching drivers is changed.

In a further aspect, there is provided a driver circuit for driving a transducer based on an input comprising: first and second switching drivers for generating respective first and second drive signals at first and second output nodes for driving the transducer in a bridge tied load configuration, wherein each of the first and second switching drivers is configured to controllably switch the respective first or second output node between two switching voltages with a controlled duty cycle; and wherein the first and second switching drivers are configured such that the two switching voltages are controllably variable to provide different BTL modes of operation. The driver circuit may be configured so as to transition between modes by: controllably varying the switching voltages for one of the first and second switching drivers whilst switching the duty cycle of that driver from one of a maximum or minimum limit of duty cycle to the other or the maximum or minimum limit; whilst maintaining the switching voltages for the other of the first and second switching drivers and applying a corresponding change in duty cycle to maintain a differential voltage.

In a further aspect, there is provided a driver circuit for driving a transducer based on an input signal comprising: first and second supply nodes for receiving an input voltage; first and second switching drivers with respective driver output nodes for driving said transducer in a bridge-tied-load configuration, each of the first and second switching drivers comprising a respective output stage for controllably switching the respective driver output node between high and low switching voltages with a controlled duty cycle to provide respective first and second drive signals. Each of the first and second switching drivers may be operable such that the high and low switching voltages can be controllably varied in at least three different driver modes. In a first driver mode the high switching voltage is at a first voltage level V1 and the low switching voltage is at a second voltage level V2, and the first and second voltage levels differ by an amount equal to the input voltage. In a second driver mode the low switching voltage is at the first voltage level V1 and the high switching voltage is higher than the first voltage level V1 by an amount equal to the input voltage. In a third driver mode the high switching voltage is at the second voltage level V2 and the low switching voltage is lower than the second voltage level V2 by an amount equal to the input voltage. A controller may control the driver mode and duty cycle of each of the first and second switching drivers based on the input signal, wherein the controller is operable in a plurality of BTL modes of operation comprising: a low-signal BTL mode to operate both the first and second switching drivers in the first driver mode; an intermediate signal BTL mode to operate one of the first and second switching drivers in the first driver mode and the other of first and second switching drivers in one of the second or third driver mode; and a high-signal BTL mode to operate one of the first and second switching drivers in the second driver mode and the other of first and second switching drivers in the third driver mode.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which:

FIG. 8 illustrates one example of suitable operating voltages for different modes of operation;

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the disclosure relate to driver circuitry for driving a transducer and, in particular, to driver circuitry suitable for driving a reactive load such as a piezoelectric transducer, although embodiments may be implemented to drive other types of transducer. Embodiments of the disclosure also relate to methods of operation of driver circuitry.

At least some embodiments of the present disclosure relate to switching drivers for generating a drive signal at a driver output node. The switching driver is operable in a plurality of different driver operating modes, wherein, in each of the different driver operating modes, the output node is switched between two switching voltages, where the switching voltages are different in the different modes of operation. Thus, in a given driver mode of operation, the switching driver operates to switch the driver output node between the relevant switching voltages with a controlled duty cycle so as to provide the drive signal with an average voltage (over the course of a cycle period) within a voltage range defined by the switching voltages. However, in a different driver mode of operation, the switching voltages are different so as to provide, in that driver mode, a different voltage range for the drive signal. The overall output voltage range for the switching driver may thus be defined by the different driver modes of operation, and each individual driver mode of operation may provide only part of the overall output voltage range, that is, the voltage range between the two switching voltages in a given mode forms only a part or a subset of the overall output voltage range.

Figure 1:
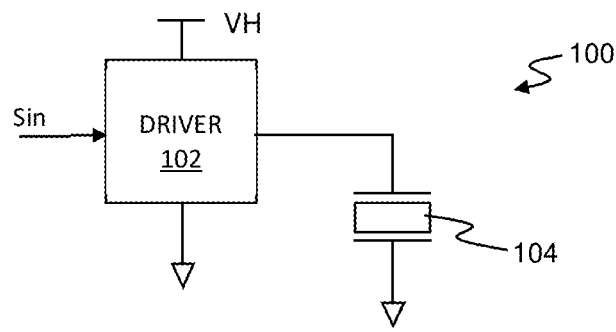
FIG. 1 illustrates one example of a single-ended driving circuit for driving a load.

The switching driver thus switches between two defined switching voltages with a controlled duty cycle to provide the drive signal at the driver output node with a desired average output voltage. In use, the average output voltage can vary within a defined voltage range between a peak high voltage VH and a peak low voltage VL. However, rather than switch a driver output node between these peak high and low voltage levels of the output range, as would be conventional for the drivers discussed with respect to FIGS. 1 and 2, the switching driver of embodiments of the disclosure switches between two switching voltages which form a subset, or only part, of the full output range between VH and VL. Thus, in each driver mode of operation, the output node is switched between two switching voltages that differ from one another by less than the full output range, but the full output range can be provided by varying the driver mode of operation, as necessary.

In effect, the switching driver may be considered to operate with variable voltage rails, where the voltage rails are controllably varied to provide different operating ranges in the different operating modes, where each of the operating ranges is only part of the full output range of the driver.

Thus, a given peak-to-peak voltage variation for the driver signal can be achieved using switching voltages with a voltage difference which is lower than the peak-to-peak variation. Using switching voltages with a lower voltage difference can be beneficial in terms of reduced switching losses and reduced radiated emissions, as well as reducing the requirement for a significant output inductance.

Figure 3:
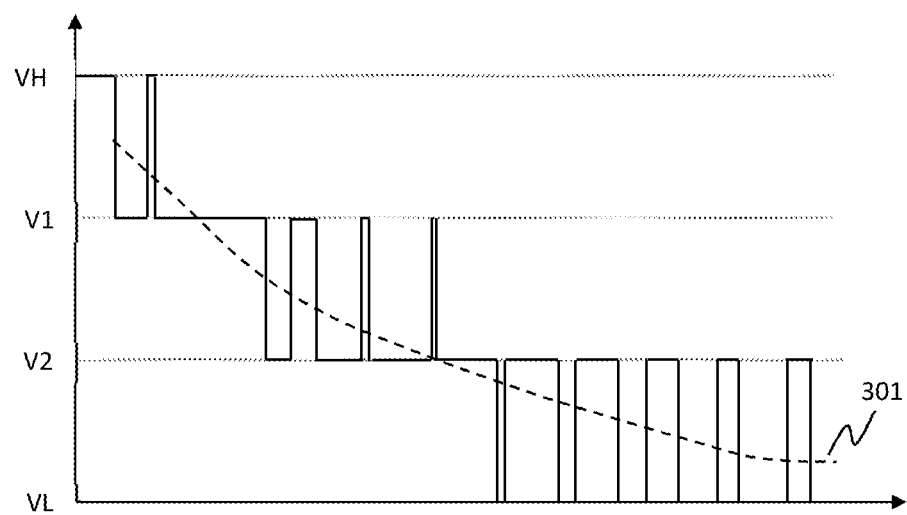
FIG. 3 illustrates example output waveforms of a switching driver according to an embodiment.

FIG. 3 illustrates this principle. FIG. 3 illustrates the switching waveforms at an output node of a switching driver according to one example and the resulting average voltage 301 over a duty cycle, i.e. the desired voltage of the drive signal output from the switching driver. It should be noted that FIG. 3 illustrates the switching waveforms for the driver signal generated at one driver output node, i.e. as would be applied to just one side of the load.

In this example, the drive signal may vary within a full output range between a peak low voltage VL and a peak high voltage VH. In this example, however, the switching driver is operable in different driver modes. In one mode of operation an output node of the switching driver may be switched between the peak high voltage VH and a first intermediate voltage V1. In another mode of operation, the output node may be switched between the first intermediate voltage V1 and a second intermediate voltage V2. In a further mode of operation, the output node may be switched between the second intermediate voltage V2 and the peak low voltage VL.

To generate a drive signal with a voltage in the range between the peak high voltage VH and the intermediate voltage V1, the output stage may operate in the mode that switches between VH and V1. For a drive voltage which is between the first intermediate voltage V1 and the second intermediate voltage, the output node may be switched between V1 and V2, and if the desired voltage for the drive signal is between V2 and the peak low voltage VL, the switching driver may operate in the mode to switch the voltage at the output node between V2 and the peak low voltage VL. In each case, the duty cycle is controlled appropriately to provide the desired average voltage.

FIG. 3 illustrates that the full driver output range between VL and VH is provided by three different driver operating modes. However, in other embodiments, there may be a different number of driver operating modes across a full output range of the switching output stage, for instance in some embodiments there may be just two driver operating modes or there may be more than three driver operating modes. The voltage ranges for the driver operating modes, defined by the switching voltages, may be defined so that the respective voltage ranges of the driver operating modes are contiguous and non-overlapping and collectively cover the whole of the full output range of the switching driver. In other embodiments however it may be advantageous to have some overlap between the output voltage ranges in the different driver operating modes. In some embodiments the magnitude of the voltage range of each of the driver operating modes, i.e. the voltage difference between the relevant two switching voltages: VL and V2, V2 and V1, or V1 and VH; may be the same as one another.

It will be understood that the reference to a voltage range, for the switching driver in a given operating mode, refers to the voltage of the drive signal at the driver output node (in terms of the average voltage over the course of a switching cycle) in that driver operating mode. The actual voltage that is applied across the load will, of course, depend on the voltage on the other side of the load, e.g. a defined DC voltage for a single-ended configuration or the voltage of a second drive signal on the other side of the load generated by another driver for a BTL configuration. The output signal range, for the output signal applied across the load, may therefore be different to the driver voltage range. For instance with reference to FIG. 3, if a defined DC voltage Vdc on the other side of the load was set to be a midpoint voltage between V1 and V2, then the switched driver may operate in the mode with switching voltages V1 and V2 for low output signal levels, up to a magnitude of (V1−V2)/2 and may swap to switching voltages V1 and VH for higher positive output signal values (up to VH−Vdc) and swap to switching voltages VL and V2 for greater negative output signal values (down to VL−Vdc).

As used herein the term driver operating mode will thus refer to the operation of a driver on one side of the load only, and the reference to a driver output voltage or output voltage range, or just voltage range, will refer to the voltage of a drive signal at the diver output node. For at least some BTL configurations, each side of the load may be seen as being driven by a respective driver, i.e. there are first and second drivers for driving both sides of the load. In some implementations, as will be discussed in more detail below, both of the drivers of a BTL implementation may be separately operable in different modes, in which case an overall BTL operating mode may be defined by the individual operating modes of the individual drivers.

The switching driver may be configured to receive a high-side supply voltage and a low-side supply voltage, for instance a positive supply voltage and ground, which define an input voltage with a magnitude which is significantly lower than the full peak-to-peak output voltage range of the switching driver. Operating in the different driver operating modes also means that the voltage difference between the switching voltages is significantly less than the full output range of the switching driver, even when operating to provide a drive signal voltage near the peak high output voltage VH. In this way, the maximum voltage stress across components of the switching driver can be kept to a magnitude which is lower than, and in some implementations significantly lower than, the peak-to-peak output voltage range of the switching driver. This can advantageously allow the use of components, e.g. transistors such as FETs, with a voltage tolerance which may be significantly lower than the peak-to-peak output voltage of the driver circuit.

The switching driver may comprise a variable boost, or level-shifting circuit, such as a charge pump, for providing some of the appropriate switching voltages for operation in the selected driver mode. The variable boost circuit may selectively positively boost (i.e. increase) the high-side input voltage and/or negatively boost (i.e. lower) the low-side input voltage to controllably vary at least one of the switching voltages for a mode of operation.

Figure 4:
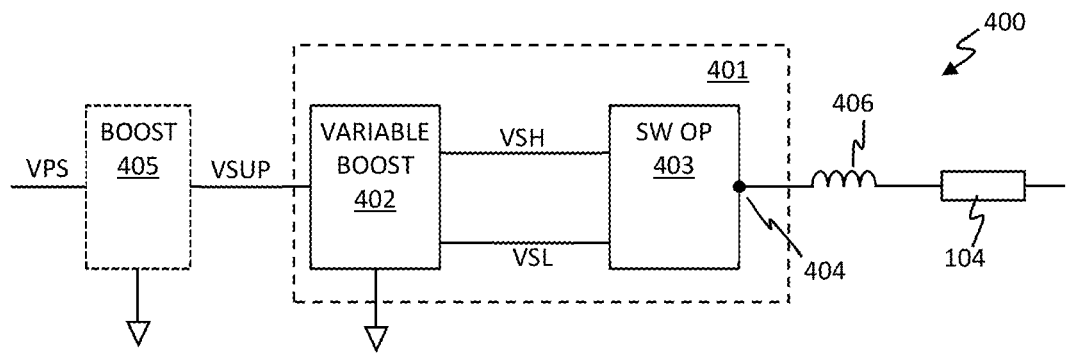
FIG. 4 illustrates one example of a driver circuit according to an embodiment.

FIG. 4 illustrates one example of driving circuitry 400 with a variable boosting switching driver 401. In the example of FIG. 4 the switching driver 401 comprises a variable boost stage 402 and a switching output bridge stage 403. The variable boost stage 402 is configured to receive a high-side supply voltage VSUP and a low-side input supply voltage, which in this example is ground, which together define an input voltage Vin, i.e. as the voltage difference between the high- and low-side supplies. The switching output bridge stage 403 receives high-side and low-side-switching voltages VSH and VSL from the variable boost stage and switches a driver output node 404 between these two switching voltages with a controlled duty cycle to provide a desired average output voltage. In the example of FIG. 4 the high-side supply voltage VSUP for the switching driver 401 is derived from a power supply voltage VPS, which may, for instance be a battery voltage. In some implementations the power supply voltage VPS, may be regulated and/or level shifted to provide an appropriate supply voltage VSUP for the switching driver, for instance there may be an initial boost stage 405 operable to provide a defined boost to the received power supply voltage VPS.

The variable boost stage is operable to controllably vary the switching voltages VSH and VSL supplied to the output bridge stage 403 so as to provide the different driver modes of operation. In one example, in one mode of operation, the supply voltages to the switching driver 401, i.e. the voltages VSUP and ground (0V), may be used as the switching voltages VSH and VSL. In this mode of operation the supply voltages received by the switching driver 401 are thus used as the switching voltages and such a mode of operation may be seen as an unboosted driver mode of operation as no voltage boosting is applied by the switching driver. It will be understood however, as described above, that at least one of the supply voltages received by the switching driver may itself have been boosted by an upstream component.

In one example, in another driver mode of operation, the supply voltage VSUP may be used as the low-side switching voltage VSL, with the variable boost stage being operable to generate a positively boosted higher voltage as the high-side switching voltage VSH. In one example, in another driver mode of operation, the low-side supply voltage, i.e. ground in this example, may be used as the high-side switching voltage VSH, with the variable boost stage being operable to generate a negatively boosted lower voltage as the low-side switching voltage VSL.

In some applications the transducer 104 could be a reactive load, such as a piezoelectric transducer. FIG. 4 also illustrates that there may be a series inductance 406 in the load path, e.g. the transducer 104 may be connected in series with an inductor 406. Especially for piezoelectric transducers, the capacitive nature of such transducers means that it may generally be beneficial to include an inductor in series with the transducer. The inductor 406 may help suppress the switching ripple at the switching frequency, whilst allowing the current to flow for the signal band of interest, e.g. at audio or ultrasonic frequencies.

Figure 5:
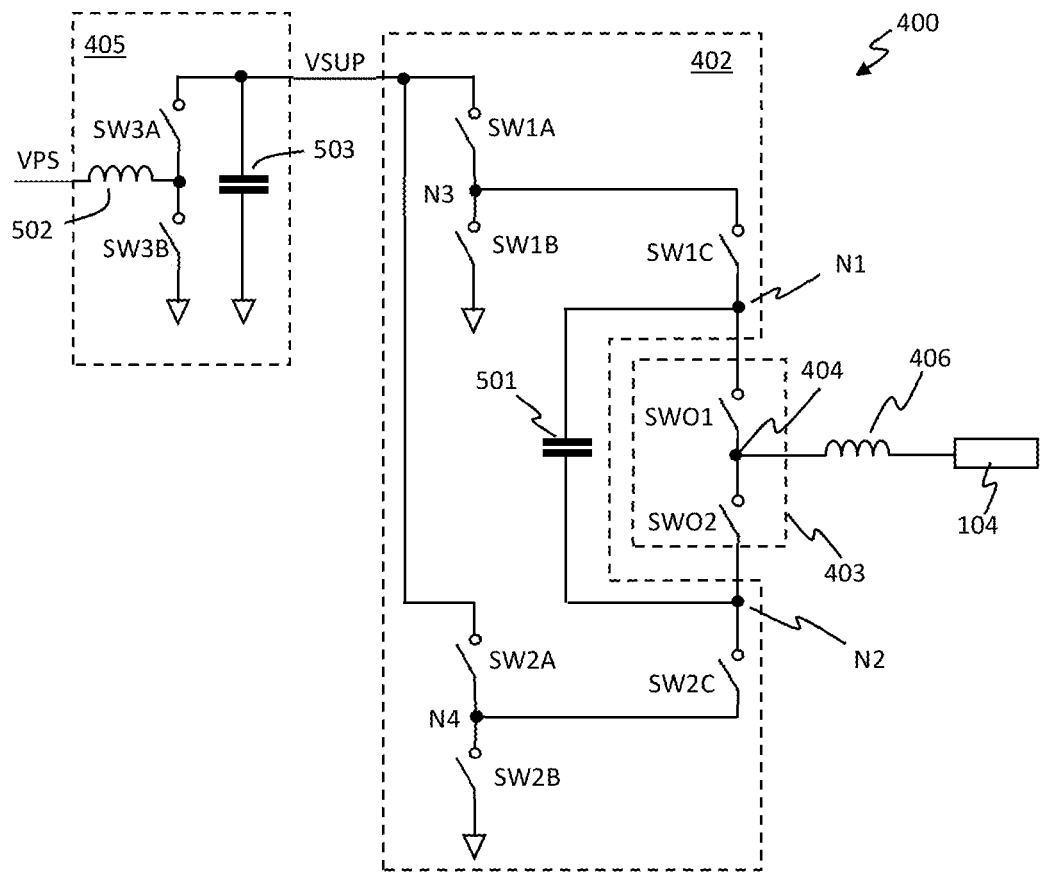
FIG. 5 illustrates one example of the driver circuit of figure in more detail.

FIG. 5 illustrates one example of the driver circuitry of FIG. 4 in more detail and similar components are identified by the same references.

FIG. 5 illustrates that the output bridge stage 403 comprises two switching paths for selectively connecting the driver output node 404 to a first node N1 or a second node N2. Each switching path comprises a respective output switch SWO1 and SWO2. The variable boost stage 402 is configured to selectively control the voltages at the first and second nodes N1 and N2 to enable the various modes of operation, and thus the first and second nodes N1 and N2 may be referred to as first and second switching voltage nodes.

The variable boost stage 402 comprises, in use, a capacitor 501 and network of switches which are operable in a plurality of different switch states so as to provide different voltages at the switching voltage nodes N1 and N2. The network of switching paths is arranged such that the capacitor 501 can be charged to a desired voltage, which in this case is the input voltage. The switch network is also arranged so that the charged capacitor 501 can selectively provide voltage boosting to one of the first and second switching voltage nodes in one of the driver modes of operation.

In the example of FIG. 5, the capacitor 501 is connected between the first and second variable boost nodes N1 and N2 and thus in parallel with the output bridge stage 403. This arrangement means that the voltage difference between the switching voltages corresponds to the voltage on the capacitor 501.

In the example of FIG. 5, the network of switches is arranged to provide a first set of switching paths SW1A, SW1B and SW1C and a second set of switching paths SW2A, SW2B and SW2C. Switching paths SW1A and SW1B are provided to selectively connect a node N3 to the high-side input voltage or the low-side input voltage respectively, i.e. VBST and ground in this example. The node N3 can thus be seen as a variable supply node or a supply select node. Switching path SW1C selectively connects the node N3 to the first variable boost node N1. Likewise, switching paths SW2A and SW2B selectively connect a node N4 to the high-side input voltage or the low-side input voltage respectively and switching path SW1C selectively connects the node N4, which can be seen as a second variable supply, or supply select, node, to the second variable boost node N2. This arrangement means that a first electrode of the capacitor 501 can be selectively connected to either of the first or second input supplies. Likewise a second electrode of the capacitor 501 can be selectively connected to either of the first or second input supplies.

It will be understood that the switching driver 401 may be implemented as an integrated circuit (IC), but in some embodiments the capacitor 501 may not be an integrated component and may be a separate component which is connected to the IC in use, i.e. the capacitor 501 may be off-chip. The capacitor 501 may therefore be connected between first and second capacitor nodes (not separately identified), which may be connected to suitable contacts of an IC for connection to an external capacitor.

In use, the driver circuit may be selectively operable in three different driver modes of operation, where the voltages at the switching voltage nodes N1 and N2, and hence the switching voltages for the output stage 403 vary in each mode.

In a first mode of operation the switching voltages may be +VSUP and ground. In a second mode of operation the switching voltages may be +2VSUP and +VSUP. In a third mode of operation the switching voltages may be ground and −VSUP. By swapping between the three modes of operation the switching driver circuit 400 can provide a peak-to-peak voltage range of 3VSUP in magnitude, from −VSUP to +2VSUP.

To provide the first mode of operation the switch network of the variable boost stage may be operable in a first switch state, in which switching paths SW1A and SW1C may be closed (with switching path SW1B open) to connect the high-side supply voltage VSUP to the first switching voltage node N1, and the switching paths SW2B and SW2C may be closed (with switching path SW2A open) to connect the second switching voltage node N2 to the low-side supply voltage, i.e. ground in this example. This results in the switching voltage nodes N1 and N2 being connected to the respective high-side and low-side supply voltages. Whilst in this first state, the output bridge stage 403 can be controlled so that switching paths SWO1 and SWO2 alternately connect the driver output node 404 to first and second switching voltage nodes with a duty cycle controlled to provide the desired average output voltage in the range 0V to +VSUP.

In this first state of the first mode of operation, the capacitor 501 is also connected between the high-side and low-side supply voltages and thus is charged to the input voltage Vin for the variable boost stage, i.e. to +VSUP in this example.

As, in this first state of the first mode, the switching voltage nodes N1 and N2 are connected to the respective high-side and low-side supplies, the load current can be supplied from the input supply to the variable boost stage.

In some implementations the switch network of the variable boost stage 402 may additionally be selectively operable in an alternative switch state to provide the same switching voltages as the first mode. Switching paths SW2B and SW1C may be closed (with switching path SW2A open) to connect the second switching voltage node N2 to ground, as in the first state, but in this alternative switch state the switching path SW1C may be open. In this case the switching voltage node N1 is isolated from the supply voltages (other than the path via the capacitor 501), but the voltage on (previously charged) capacitor 501 will maintain the voltage at the first switching voltage node N1 substantially equal to VSUP. In this alternative switch state, any load current can be supplied from the capacitor 501 (when the output path SWO1 is closed).

It will be noted that, in this first mode of operation the maximum voltage difference across any of switching paths, and thus any of the switches of the switch network, is substantially equal to the magnitude of the input voltage Vin, i.e. the voltage difference between the high-side and low-side supply voltages. The voltages at the switching voltage nodes N1 and N2 are +VSUP and ground respectively, whilst the voltages at node N3 and N4 are VSUP and ground respectively (at least in the first state—in the alternative state the voltage at node N3 may be floating or this node could be selectively connected to VSUP or ground by switching paths SW1A or SW1B respectively).

To provide the second mode of operation, switching path SW2A is closed (with switching path SW2B open) to connect node N4 to the high-side supply voltage VSUP and switching path SW2C is closed to connect node N4 to the second switching voltage node N2. In this state, the second switching voltage node N2 is thus substantially equal to the high-side supply voltage +VSUP. Switching path SW1C is open, and the voltage of the capacitor 501, which is charged to the input voltage Vin, in this case equal to +VSUP, positively boosts the voltage at the first switching voltage node N1 to +2VSUP. This driver mode can thus be seen as a positive boosted mode of operation.

In this second switch state the voltage at the first switching voltage node N1 is boosted to +2VSUP (i.e. boosted above the high-side supply voltage VSUP by the voltage Vin on the capacitor 501), and thus this node is disconnected from the supply voltages. It will be noted that if switch SW1C were not present, this disconnection could be achieved by opening both switching paths SW1A and SW1B. However, in that case the voltage at node N3 would be the same as that at the first switching voltage node N1, i.e. equal to +2VSUP and thus the voltage across switch SW1B would be equal to +2VSUP, i.e. this switch would be subjected to a voltage stress of twice the input voltage. The inclusion of switching path SW1C reduces the voltage stress. Switching path SW1C is open, to disconnect the first switching voltage node N1 from the supply select node but the switching path SW1A may be closed (with switching path SW1B open) to connect node N3 to the high-side supply voltage VSUP. This limits the voltage difference across the switch of the open switching path SW1C to a voltage of magnitude equal to the input voltage Vin (which in this case equals VSUP). Thus, the maximum voltage difference across any of the switching paths is again substantially equal to the magnitude of the input voltage.

Whilst the variable boost stage is in this second switch state, the output bridge stage 403 can be controlled so that the output switches of the switching paths SWO1 and SWO2 alternately connect the driver output node 404 to first and second switching voltage nodes with a duty cycle controlled to provide the desired average output voltage within the range +VSUP to +2VSUP.

When operating in this second driver mode, the load current will be drawn from the capacitor 501. However, if the capacitance of the capacitor 501 is relatively large and the load for the output stage is a reactive load, the capacitor 501 can provide the charge needed with just one charge pumping cycle. In particular, when the output bridge stage 403 drives an inductor 406 in the output path, this can enable lossless movement of charge between the load and the capacitor 501 for charge recovery.

It will be understood that for driving a transducer with a drive signal based on an input signal, such as an audio signal, the required drive voltage of the switched driver will vary with the input signal. High output voltages, such as enabled in the second driver mode of operation may only be required for relatively large amplitude drive signals and for only part of the input signal cycle, when the input signal is near its peak. Thus, in normal operation, the second driver mode may be expected to be used for only parts of the signal cycle of the input signal, and for the switching driver circuit to be operating in the second driver mode of operation, e.g. in the range +VSUP to +2VSUP, the drive signal output from the switching driver will have passed through the voltage range of the first mode, e.g. 0V to +VSUP. Thus prior to operating in the second driver mode there will have been a period of operation in the first driver mode and thus the capacitor 501 will have been charged during such operation in the first driver mode.

The size of the capacitor 501 may thus be selected, based on the reactive load to be driven, such that a single charge of the capacitor provides sufficient charge for the driving of the reactive load over the course of a signal cycle for the input signal.

It will be noted that in the second switch state the second switching voltage node is connected to a voltage other than the second supply voltage (e.g. ground) and, in the example of FIG. 5, this is the first supply voltage VSUP. However, in some embodiments a different defined voltage, say 0.5VSUP for example, could be derived and supplied to the second switching voltage node in this second stage, in which case the capacitor would boost the voltage at the first switching voltage node to 1.5VSUP.

To provide the third mode of operation, the switch network of the variable boost stage may be operable in a third switch state, in which switching paths SW1B and SW1C are closed (with switching path SW1A open) to connect the first switching voltage node to the low-side supply voltage, i.e. ground. The first switching voltage node N1 is thus substantially equal to the low-side supply voltage, i.e. ground in this example. Switching path SW2C is open and the voltage of the capacitor 501, which is charged to the input voltage, i.e. VSUP in this case, negatively boosts, or lowers, the voltage at the second switching voltage node N2 to −VSUP. To control the voltage stress across the switch path SW2C, the switching path SW2B may be closed to cause the voltage at node N4 to be equal to ground.

Whilst the switch network of the variable boost stage is in this third switch state, the output bridge stage 403 can be controlled so that the output switches SWO1 and SWO2 alternately connect the driver output node 404 to first and second switching voltage nodes with a duty cycle controlled to provide the desired average output voltage within the range −VSUP to 0V.

It will thus be understood that the variable boost stage 402 is operable to controllably vary the voltages at the switching voltage nodes N1 and N2 to provide different switching voltages for the output stage 403 in the different driver modes of operation. One of switching voltages in the second and third modes of operation is selectively boosted by the voltage of the capacitor 501, which is charged during operation in the first mode by the input voltage, i.e. the voltage between the high-side supply voltage and the low-side supply voltage, VSUP and ground in this example. Each of the operating modes therefore involves switching voltages that differ from one another by a magnitude equal to the input voltage Vin for the variable boost stage, i.e. the difference between the high-side and low-side supply voltages. In the embodiment of FIG. 5 the capacitor is charged to the input voltage and as the capacitor is connected in parallel with the output stage 403, the switching voltages in a given mode of operation differ by an amount equal to the input voltage. In the embodiment of FIG. 5 one capacitor may be used to selectively provide both positive boosting or negative boosting as required.

It will also be clear that the maximum voltage stress across any of the individual switching paths can be limited to be substantially equal to the input voltage. Typically, each switching path may be implemented with a transistor, e.g. a MOSFET, as a switch and this means that a drain-source voltage tolerance of the transistor need only be sufficient to withstand a voltage of magnitude equal to the input voltage supply to the variable boost stage. Note that for correct operation of the transistor it may be beneficial to implement at least some of the transistor in doped wells which are driven with voltages based on the switching voltages, as will be discussed in more detail below.

The input voltage for the switching driver 401 may thus define the voltage tolerance required for the switches of the switch network of the variable boost stage and also define the voltage range of the different operating modes, and hence the overall voltage range of the switching driver.

As noted above, in some examples, to provide an appropriate input voltage for the variable boost stage 402, the driver circuitry 400 may comprise a first boost stage 405 for receiving a power supply voltage VPS and boosting the power supply voltage to provide at least one of the voltage supplies for the switching driver 401. In this example the first boost stage receives the power supply voltage VPS and boosts the power supply voltage VPS to provide the supply voltage VSUP. The first boost stage, if present, could be any suitable DC-DC converter with a voltage boost and FIG. 5 illustrates that the first boost stage may comprise a boost converter with an inductor 502, control switches SW3A and SW3B and a reservoir capacitor 503 coupled to maintain the output voltage VBST.

In some examples the power supply voltage VPS could be a battery voltage and thus could be of the order of a few volts, say a voltage at or around 4.2V. In some examples this supply voltage could be boosted to a supply voltage VSUP of say 20V or so to provide the high-side supply to the switching driver 401. The low-side voltage may, in some examples, be ground, so the input voltage for the switching driver may be 20V. For the example illustrated in the FIG. 5, the switching driver may thus be operable to generate a drive signal with a voltage range of 60V, from a voltage of −20V to a voltage of +40V, by selectively operating in one of the three different operating modes, a −20V to 0V mode, a 0V to +20V mode and a +20V to 40V mode.

The use of a first voltage defined boost stage to generate a first boosted voltage at a predetermined level which may then be selectively boosted by a variable boost stage represents one particular aspect of the present disclosure. In general, therefore, at least some embodiments relate to driver circuitry comprising a switching output stage 403 for driving an output node 404 between two switching voltages with a controlled duty cycle, where the two switching voltages are selectively variable. A variable boost stage 402 may have first and second input nodes configured to receive a first high-side voltage and a first low-side voltage respectively and provide the switching voltages at first and second variable boost nodes. The variable boosting stage may be operably to selectively boost at least one of the first high-side voltage and the first low-side voltage to controllably vary the switching voltages in different modes of operation. The driver includes a first defined boost stage 405 for a first defined boost stage configured to receive a supply voltage and boost the supply voltage to a defined voltage level to provide one of said first high-side voltage and first low-side voltage. The variable boost stage may be a switched capacitor variable boost stage, e.g. charge pump, which can allow for charge recovery from the load.

Figure 6:
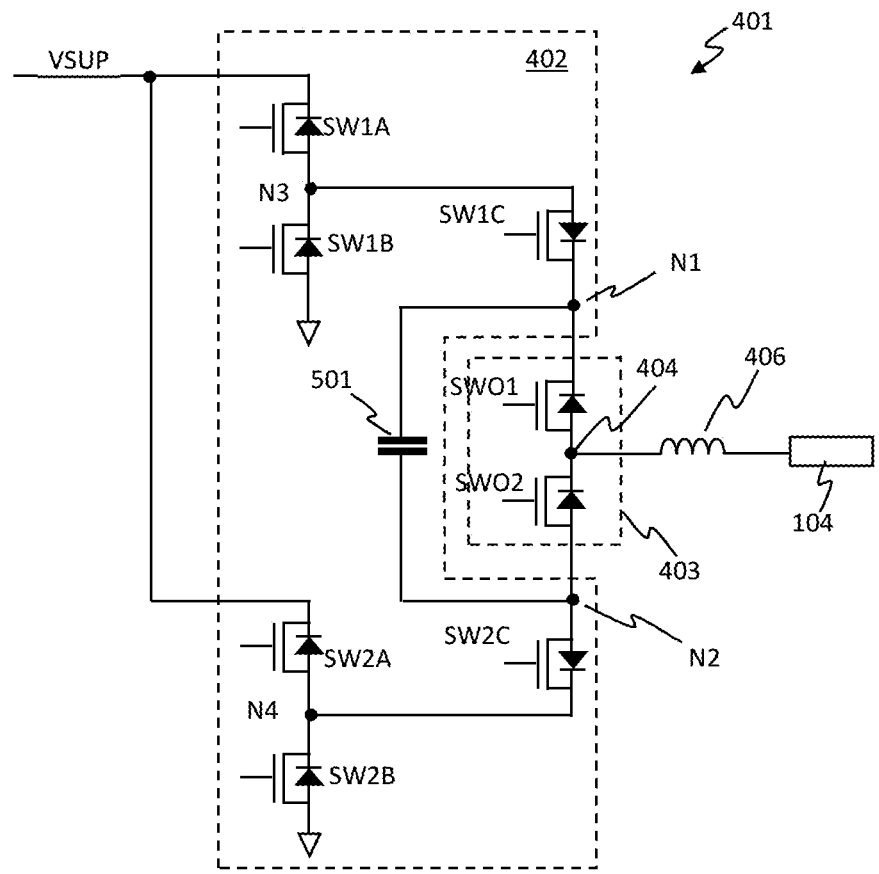
FIG. 6 illustrates one example of a MOSFET implementation of a switching driver.

As described above, each of the switches of the network of switches of the variable boost stage 402 and also the output switches of the output bridge stage 403 may be implemented by a suitable transistor, e.g. a suitable MOSFET. FIG. 6 illustrates an example of a switch driver such as described with respect to FIG. 5, wherein each of the switches of the switching paths is implemented by a FET.

Figure 7:
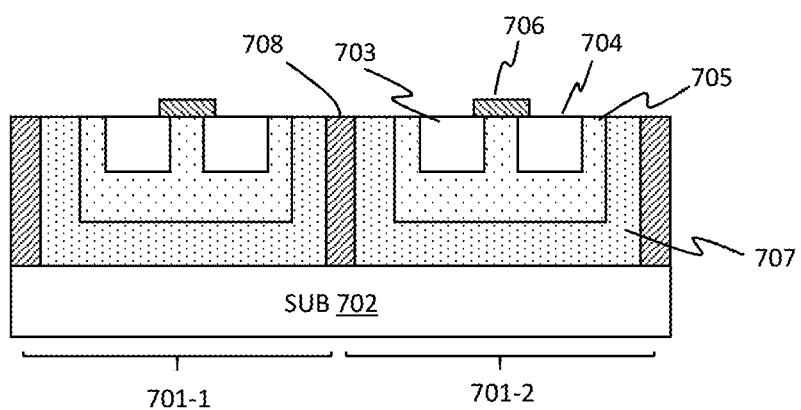
FIG. 7 illustrates one example of NMOS devices suitable for use in the switching driver of FIG. 6.

In one implementation, each of the FETs illustrated in FIG. 6 may be an NMOS FET device. At least part of the NMOS devices may be formed in deep N-wells as will be understood by one skilled in the art. FIG. 7 illustrates schematically an example of two NMOS devices 701-1 and 701-2 formed on a substrate 702. Each of the NMOS devices comprises source and drain regions 703 and 704 formed in a bulk region 705, with a gate electrode 706 for controlling channel conduction. The bulk region 705 is disposed within a deep N-well 707. Isolation regions 708 isolate the N-wells from neighbouring devices.

In use, the substrate 702 and isolation regions 708 will typically be held at ground and the bulk 705 is typically coupled so as to be driven to the same voltage as the source 703. The deep N-wells 707 may be driven with a voltage that varies according to the signal range on the output to avoid P-well to deep N-well breakdown or unwanted forward biasing of the deep N-well to the substrate or P-well. By driving the voltages in this way, the transistor devices may be protected from high voltages.

FIG. 8 illustrates a table showing one example of how the N-wells of the NMOS switches of the switching driver 401 of FIG. 6 may be driven when operating in the different modes. The table illustrated in FIG. 8 lists the switches of the switching driver for each of the operating modes, and in each case, the state of each of the switches, i.e. on, off or being operated with a controlled duty cycle (represented by DC), is indicated, along with the respective source/bulk and drain voltages and the voltage to which the respective N-well may be driven.

Figure 9:
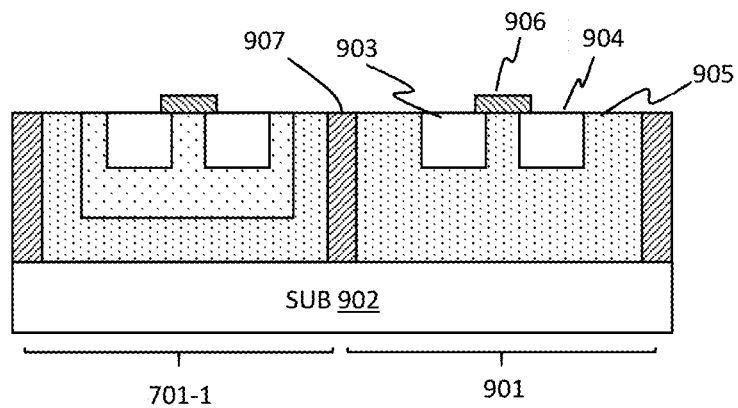
FIG. 9 illustrates an example of one example of NMOS and PMOS devices suitable for use in the switching driver of FIG. 6.

In another implementation, the FETs illustrated in FIG. 6 may be a mixture of NMOS and PMOS devices. For example, the switches of switching paths SW1A, SW1C, SWO1 and SW2A may be implemented as PMOS devices, whilst the switches of switching paths SW1B, SWO2, SW2B and SW2C may be implemented as NMOS devices. As discussed, above the NMOS devices may be formed in deep N-wells. FIG. 9 illustrates schematically an example of an NMOS device 701 and a PMOS device 901 formed on a substrate 902. The NMOS device 701 may have the same structure as the NMOS device discussed with reference to FIG. 7. The PMOS device also comprises a source region 903 and drain region 904 in a bulk region 905, with a gate 906, but for the PMOS device, as the bulk region is N-type there is no need for any N well.

In use, the switching driver 401 could be operated in the same three modes as described above, and in operation the N-wells of the NMOS devices could be driven in the same way as illustrated in FIG. 8, with the bulk of the PMOS devices connected to be at the same voltage as the source.

Figure 10:
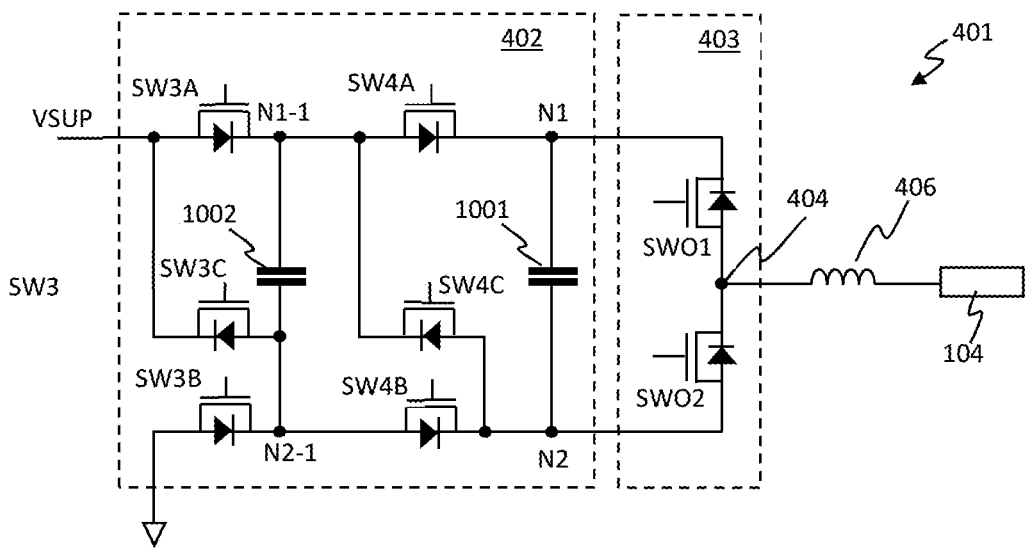
FIG. 10 illustrates another example of an implementation of a switching driver.

FIG. 10 illustrates another example of a switching driver 401 according to an embodiment. The embodiment of FIG. 10 includes an output bridge stage 403 with first and second output switches SWO1 and SWO2 connected between first and second switching voltage nodes N1 and N2, in a similar manner as described with respect to FIG. 5. The switching driver 401 also includes a variable boost stage 402 for controlling the voltages at the switching voltage nodes N1 and N2, which includes a first capacitor 1001 connected in parallel with the output bridge stage 403 between the first and second switching voltage nodes N1 and N2 and a network of switches, but in this example the variable boost stage also includes a second capacitor 1002.

The network of switches includes switching paths SW3A, SW3B and SW3C, which, together with the second capacitor 1002 effectively provide a first variable boost sub-stage. The second capacitor 1002 is coupled between variable boost nodes N1-1 and N2-1 of the first sub-stage, and switching paths SW3A and SW3B selectively connect variable boost nodes N1-1 and N2-1 to the high-side and low-side supply voltages respectively, in this example VSUP and ground. In use, with switching paths SW3A and SW3B closed (and switching path SW3C open), the variable boost nodes N1-1 and N2-1 of the first sub-stage are substantially equal to the respective high-side and low-side supply voltages and the second capacitor 1002 is charged to a voltage equal to the input voltage. Switching path SW3C selectively connects the high-side supply voltage to the second variable boost node N2-1. With switching path SW3C closed (and the switching paths SW3A and SW3B open), the variable boost node N2-1 of the first stage is driven to be substantially equal to the high-side supply voltage, i.e. +VSUP in this example, and the voltage at variable boost node N1-1 is positively boosted by the capacitor voltage, i.e. to +2VSUP in this example.

Switching paths SW4A, SW4B and SW4C together with the first capacitor 1001, effectively provide a second variable boost sub-stage with the same general structure as the first sub-stage and which is operable in generally the same way. The second variable boost sub-stage receives the voltages at nodes at the variable boost node N1-1 and N2-1 of the first boost sub-stage as respective high-side and low-side voltages. The second variable boost sub-stage is thus operable to either provide these voltages received from the first boost sub-stage as switching voltages to the switching voltage nodes N1 and N2, or to provide the voltage from node N1-1 to the second switching voltage node N2, with the capacitor 1001 providing further positive boosting for the voltage at the first switching voltage node N1.

The switching driver of FIG. 10 is thus operable in three different operating modes, a first (no boosting) mode, a second (single) boosted mode and third (double) boosted. For the example of FIG. 10 where the high-side and low-side voltage inputs are +VSUP and ground respectively, this means the first mode will have switching voltages of 0V and +VSUP, the second mode will have switching voltages of +VSUP and +2VSUP and the third mode will have switching voltages of +2VSUP and +3VSUP.

In the first mode of operation, switching paths SW3A, SW3B, SW4A and SW4B may all be closed so as to charge both the first and second capacitors. This means that the input supplies are connected to the switching voltage nodes and any load current can be supplied from the input supplies. In an alternative state of operation, the switches SW3A and SW3B could be opened so that the capacitors 1001 and 1002 provide the load current.

In operation in the second mode, the boosting could be provided by the first boost sub-stage, i.e. with switching path SW3C closed (and SW3A and SW3B open) and the second boost sub-stage may be operated to pass through the voltages without any boosting, i.e. with switching paths SW4A and SW4B closed (and SW4C open). Alternatively, the first boost sub-stage may effectively be bypassed, with switching path SW3A closed (and SW3C and SW3B open) and the boosting provide by the second boost sub-stage with switching path SW4C closed (and SW4A and SW4B open).

The switching driver 401 illustrated in FIG. 10 is thus also operable in three different driver operating modes, wherein the output range of the switching driver in each mode is equal to the input voltage for the switching driver 401 and the full output range of the driver is thus equal to three times the input voltage. The maximum voltage stress across any of the switching paths is limited to magnitude of the input voltage and thus for an input voltage equal to 20V, a drain-source voltage tolerance of 20V would be sufficient for the transistors of the switching paths.

However, the peak high switching voltage for the switching driver of FIG. 10 is, in this example, equal to +3VSUP compared to a maximum voltage of +2VSUP in the example of FIG. 5. In some applications this may require the transistor devices to have a sufficiently large drain to substrate breakdown voltage.

Figure 11:
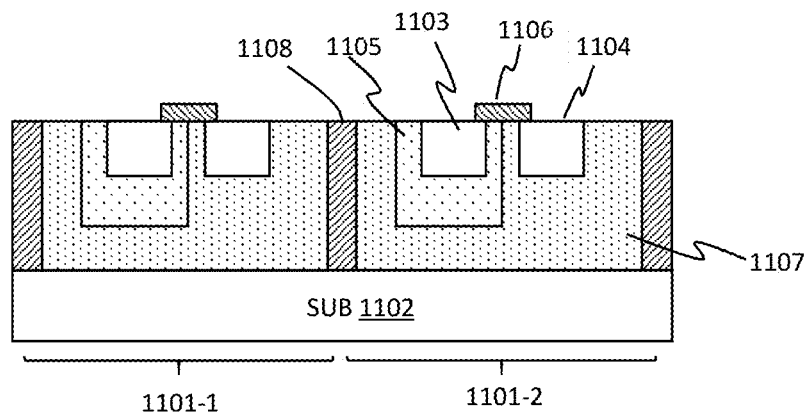
FIG. 11 illustrates NMOS devices suitable for use in the switching driver of FIG. 10.

The switching driver illustrated in FIG. 10 may be implemented by NFET devices for each of the switching paths. FIG. 11 illustrates schematically one example of suitable NFET devices 1101-1 and 1101-2. The devices are formed on a substrate 1102 and comprise source and drain regions 1103 and 1104, bulk region 1105 and gate 1106. In this example, however, the source region 1103 is formed within the bulk region 1105 within an N-well 1107, but the drain region 1104 is formed within the N-well.

An isolation region 1108 may isolate the devices from one another and, in use, the isolation region 1108 and substrate 1102 may be grounded. In use, the N-well 1107 may be driven to a voltage that is the same as the drain voltage.

FIG. 10 illustrates an example, where there are two boosting sub-stages for providing selective positive boosting, but it will be understood that other arrangements are possible, for instance there may be more selective boosting sub-stages to allow more output voltage ranges and at least some of the multiple boosting sub-stages could provide negative boosting.

In general, therefore embodiments provide a switching driver for generating a drive signal for driving a load, where the switching driver is operable in a plurality of different modes, where each of the modes involves switching between different switching voltages so that the output range of the driver varies in the different modes, and where the output range for each mode corresponds to only a subset of the full output range of the driver.

In some examples the switching driver may be arranged to drive a transducer load in a single-ended configuration. Referring back to FIG. 4, the switching driver 401 may therefore be arranged to provide a first driving signal at the driver output node 404 for driving the transducer 104, where the other side of the load is held at a DC voltage. The DC voltage could, for example, be a voltage which is at a midpoint of the full operating range of the switching driver. For instance, for the example discussed with reference to FIG. 5, where the switching driver is operable between a peak high-side voltage of +2VSUP in the second mode and a peak low-side voltage of −VBST in the third mode, the midpoint voltage is +VSUP/2. In some examples the level of the DC voltage at the other side of the load may be varied in use, as will be described in more detail below.

Figure 12:
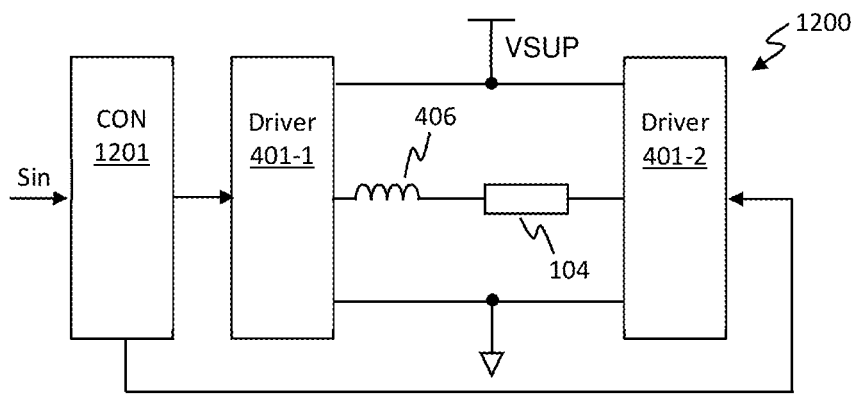
FIG. 12 illustrates a driver circuit in a bridge-tied-load configuration.

In some implementations, however, a driver circuit may comprise two switching drivers arranged to drive a load in a BTL configuration. FIG. 12 illustrates a driving circuit 1200 according to an embodiment with respective first and second switching drivers 401-1 and 401-2 for driving the load in a BTL arrangement. Each of the switching drivers 401-1 and 401-2 may be a switching driver according to any of the embodiments described herein. In the example of FIG. 12 the two switching drivers 401-1 and 401-2 are provided with the same high-side and low-side voltage inputs as one another, in this example VBST and ground.

FIG. 12 illustrates that the switching of each switching driver 402-1 and 402-2 may be controlled by a controller 1201. The controller 1201 receives the input signal Sin and based on the input signal Sin, determine the appropriate driver mode of operation for each of the switching drivers 401-1 and 401-2 and generate switching control signals for controlling the relevant switches of the network of switches so as to set an appropriate switch state to select the mode of operation. The controller also generate the relevant switching control signals for the output switch of the output stage of each of the switching drivers 401-1 and 401-2 to alternate between the relevant switching voltages with an appropriate duty cycle so as to provide the desired voltage at each driver output node and hence the desired differential voltage across the load.

The controller 1201 thus controls the driver mode of operation of each of the switching drivers 401-1 and 401-2 so as to provide a desired output voltage across the load. The controller 1202 controls the individual driver modes of the drivers 401-1 and 401-2 to provide an appropriate overall BTL operating mode of the driver circuit to provide the desired output signal across the load.

For instance, consider the example where each of the switching drivers 401-1 and 401-2 is a switching driver as discussed with reference to FIG. 5, and thus is operable in a first driver mode with a driver output voltage in the range 0V to +VSUP, a second driver mode with a driver output voltage in the range +VSUP to +2VSUP or a third driver mode with a driver output voltage in the range −VSUP to 0V. The first mode can be seen as providing a mid-range drive voltage, with the second and third modes providing high-range (more positive than the mid-range) and low-range (more negative than the mid-range) driver voltages respectively. For the example of the switched driver of FIG. 5, the first mode can be seen as an unboosted mode of operation of the driver as the voltage supplies received by the switching driver are used as the switching voltages. The second mode can be seen as a positive boosted mode and the third mode can be seen as a negative boosted mode.

To generate a differential voltage across the load with a magnitude in the range of 0V to +VSUP, each of the drivers 401-1 and 401-2 may be operated in the first driver mode, i.e. with a driver voltage range between 0V and +VSUP. In effect the first switching driver 401-1 generates a first drive signal in the range of 0V to +VSUP and the second switching driver 401-2 generates a second drive signal in the range of 0V to +VSUP.

Assuming that a positive voltage across the load corresponds to the voltage at the output node of first switching driver 401-1 being more positive than the voltage at the output node of the second switching driver 401-2, then to provide a positive voltage, the duty cycle for the first switching driver 401-1 (in terms of proportion of time spent at the high-side switching voltage) should be greater than that for the second switching driver 401-2. The differential drive signal across the load may thus be varied between +VSUP (with the first drive signal at a voltage +VSUP and the second drive signal at a voltage of 0V) and −VSUP (with the first drive signal at a voltage +VSUP and the second drive signal at a voltage of 0V).

In some applications the controller could control the two switching drivers 401-1 and 401-2 so that the drivers switch synchronously in antiphase, i.e. such that the switching drivers switch between the switching voltages at the same time as one another so that the output node of the first driver 401-1 is connected to its respective high-side switching voltage whilst the output node of the second driver 401-2 is connected to its respective low-side switching voltage and vice-versa. In some implementations, however, it may be beneficial, at least in some use cases, for the switching of the two output stages of the switching drivers to be asynchronous, i.e. such that the switching drivers 401-1 and 401-2 may switch between their respective switching voltages at different times to one another such both switching drivers may be connected to their respective high-side or low-side switching voltage at the same time for at least part of the duty cycle.

To provide a differential voltage across the load of a greater magnitude, the switching drivers on the opposite sides of the load may be operated in different driver modes from one another. For instance, a differential voltage across the load with a magnitude in the range of VSUP to 3VSUP could be achieved by operating the switching driver on one side of the load in the second driver mode, to provide a driver voltage in the range +VSUP to +2VSUP whilst the switching driver on the other side of the load is operated in the third driver mode, to provide a driver voltage in the range 0V to −VSUP.

For instance, a positive differential voltage across the load could vary from +VSUP (with the voltage of the first driver signal from driver 401-1 at a voltage equal to +VSUP and the voltage of the second driver signal from driver 401-2 at 0V), to +3VSUP (with the voltage of the first driver signal from driver 401-1 at a voltage equal to +2VSUP and the voltage of the second driver signal from driver 401-2 equal to −VSUP).

For a relatively low magnitude differential voltage across the load, i.e. a differential signal in the range −VSUP to +VSUP, the controller 1201 could control the switching drivers 401-1 and 401-2 to each operate in the first driver mode (i.e. each generating a mid-range voltage). This can be seen as a first, low signal level BTL mode of operation of the driver circuit. For higher magnitudes of differential voltage across the load, i.e. a magnitude greater than VSUP (up to the maximum magnitude of 3VSUP), the controller 1201 could control one of the drivers 401-1 and 401-2 to operate in the second mode of operation (to provide a more positive drive voltage) and the other to operate in the third mode of operation (with a more negative drive voltage). Operating in this way, with one driver operating in the second mode and one driver operating in the third mode can be seen as a high-signal level BTL mode of the driver circuit. Which of the drivers 401-1 and 401-2 operates in the second mode and which in the third will be controlled depending upon whether a positive or negative differential voltage is required across the load.

In some implementations the controller 1201 could be implemented to swap between just these BTL modes of operation, i.e. to operate in the low-signal BTL mode for differential signal magnitudes below VSUP and then swap to the relevant positive or negative high-signal BTL mode as appropriate when the differential signal magnitude increases.

However, it can, in some implementations, be beneficial to also operate with one of the switching drivers in the first driver mode of operation (to provide a mid-range drive voltage) whilst operating the other switching driver in one of the second or third modes of operation.

For example, the first switching driver 401-1 could be operated in the second driver mode to switch between voltages in the range of +VSUP to +2VSUP, whilst the switching driver 401-2 is operated in the first mode to switch between 0V and +VSUP. Thus, the first switching driver 401-1 generates a first drive signal with a voltage in the range of +VSUP to +2VSUP whilst the second switching driver generates a second drive signal in the range of 0V to +VSUP. This could allow a differential voltage in the range of 0V (with the first drive voltage from driver 401-1 at +VSUP and the second drive voltage from driver 401-2 at +VSUP) to +2VSUP (with the first drive voltage from driver 401-1 at +2VSUP and the second drive voltage from driver 401-2 at 0V).

Alternatively, the first switching driver 401-1 could be operated in the first driver mode, and switched between 0V and +VSUP, whilst the second switching driver 401-2 is operated in the third mode to switch between −VSUP and 0V. Thus, the first switching driver 401-1 generates a first drive signal with a voltage in the range of 0V to +VSUP whilst the second switching driver 401-2 generates a second drive signal with a voltage in the range −VSUP and 0V, to apply a differential signal across the load in the range of +VBST to +2VBST. Again, this could allow a differential voltage in the range of 0V (with the first drive voltage from driver 401-1 at 0V and the second drive voltage from driver 401-2 at 0V) to +2VSUP (with the first drive voltage from driver 401-1 at +VSUP and the second drive voltage from driver 401-2 at −VSUP).

Operating the switching drivers 401-1 and 401-2 with one driver operating in the first driver mode (to provide a mid-range voltage) whilst operating the other switching driver in one of the second or third driver modes, can thus be seen as an intermediate signal-BTL mode of operation.

Table 1 below summarises one example of how different ranges of differential output voltages Vdiff across the load may be generated by voltages Vx at the outputs of the first and second switching drivers 401-1 and 401-2 where the high-side voltage input, i.e. VSUP, is 20V and the low-side voltage input is ground.

TABLE 1

| Vdiff | Vx 401-1 | Vx 401-2 |
|---|---|---|
| 0-20 V BTL low-signal mode | 0 to 20 V (first driver mode) | 0 to 20 V (first driver mode) |
| 20-40 V BTL intermediate signal mode | 20 to 40 V (second driver mode) | 0 to 20 V (first driver mode) |
| 40-60 V BTL high signal mode | 20 to 40 V (first driver mode) | −20 to 0 V (third driver mode) |

Differential voltages of the opposite polarity across the load can be achieved in a similar manner by swapping the relevant driver modes of operation of the first and second switching drivers 401-1 and 401-2.

It will thus be clear that, in this example a differential driving signal can be applied across the load which can vary in the range from +3VSUP to −3VSUP, i.e. a peak-to-peak differential voltage range equal in magnitude to six times the input voltage for the switching drivers 401-1 and 401-2. As discussed above, the switching drivers 401-1 and 401-2 may be implemented so the maximum voltage stress across the switching paths is equal to the input voltage, i.e. VSUP, and thus the switching drivers may only require a voltage tolerance which is of the order of $\frac{1}{6}^{th}$ of the peak-to-peak differential output of the driver circuitry 1200. Thus, the driver circuitry 1200 may utilize transistors, for example MOS transistors, having less breakdown voltage than the peak-to-peak differential output voltage, for example approximately ⅙th the breakdown voltage of the peak-to-peak differential output voltage of the driver circuitry.

Table 1 illustrates just one example, however, and the controller may control the respective driver modes of operation according to different differential output ranges. The controller may operate the first and second switching drivers in a given differential or BTL mode of operation, where each differential or BTL mode of operation involves a different combination of individual driver modes of the first and second switching drivers.

Driver circuitry which thus drives a load with two switching drivers in a BTL configuration, where the switching voltages on both sides of the load can be separately varied represents another aspect of this disclosure. Thus, in general, at least some embodiments relate to a driver circuit for driving a transducer based on an input signal comprising first and second switching drivers configured to drive the transducer in a bridge-tied-load configuration; wherein each of the first and second switching drivers comprise an output stage for controllably switching a driver output node between first and second switching voltages with a controlled duty cycle. Each of the first and second switching drivers is operable in a plurality of driver modes, wherein the first and second switching voltages are different in each of said modes. A controller controls the driver mode of operation and duty cycle for each of the first and second switching drivers, such that the first and second switching drivers may be operable in different driver modes from one another with different switching voltages.

The controller 1201 may thus control the driver mode of operation of each of the switching drivers 401-1 and 401-2, and the respective duty cycle, so as to provide a desired differential drive voltage based on the input signal Sin and may vary the driver mode of operation of the switching drivers as the input signal varies.

Thus, for example, consider the operation illustrated in table 1 above, and consider that the required differential output voltage, based on the input signal is 0V. The controller 1201 may operate both switching drivers in the first driver mode (0 to 20V), i.e. operate in the low-signal level BTL mode, and may control the switch drivers with equal duty cycles. If the value of the input signal then rises over time, the controller could increase the duty cycle of the first switching driver/reduce the duty cycle of the second switching driver to provide the increased differential output voltage. If the required voltage for the drive signal continues to rise, in particular to a voltage of greater than 20V, the controller could then swap the mode of operation of the first switching driver to the second driver mode of operation (20 to 40V) with an appropriate duty cycle.

In theory, during the operation in the first driver mode, the duty cycle of the first switching driver 401-1 could be increased to 100% whilst the duty cycle of the second switching driver 401-1 was decreased to 0% to provide a differential output voltage of 20V. In practice, however, limits on the clock speeds and the speed of the response of the transistors means that duty cycles of 100% and 0% may not be practically realisable. Thus, in some implementations it may not be practical to generate a differential output voltage of 20V in the low signal level BTL mode, with the first and second switching drivers 401-1 and 401-2 each operating in the first driver mode with switching voltages of 0V to 20V.

However, a differential voltage of 20V could be achieved by operating in the intermediate signal level BTL mode, with one switching driver operating in the first driver mode and the other operating in one of the second or third driver modes. Thus, the first switching driver could be operated in the second driver mode (in this example with switching voltages of 20V and 40V) to generate a first drive signal with a voltage greater than 20V, say 22V for example, whilst the second switching driver 401-2 is operated in the first mode (with switching voltages of 0V and 20V) to provide a voltage greater than 0V, say 2V, so that the differential voltage between the first and second driving signals corresponds to the required differential output. This allows the desired output signal to be generated whilst operating both switching drivers with valid duty cycles.

In some cases, the duty cycle for a switching driver could be validly varied within certain limits, e.g. between lower and upper or minimum and maximum duty cycle limits, say between 5% and 95% or between 10% and 90% in some implementations, although differences may be used in other implementations (which may be, but need not be, symmetrical about 50%). In use, the controller 1201 may operate each of the switching drivers 401-1 and 401-2 in a given mode of operation and controllably vary the duty cycle with input signal between these limits, but once the relevant limit for at least one of the switching drivers is reached the controller 1201 may swap the driver mode of operation of one of the switching drivers at the duty cycle limit, and controllably vary the duty cycles of both drivers, based on the new operating mode, to provide an equivalent differential voltage. This can, however, vary the common-mode voltage of the first and second drive signals applied to the load in the different BTL modes of operation.

Table 2 below illustrates one example of how various different differential voltages could be achieved, for the example where switching drivers are operable in a first driver mode with switching voltages of 0V and 20V, a second driver mode with switching voltages of 20V and 40V and a third driver mode with switching voltages of 0V and −20V. Table 2 illustrates the differential output voltage Vdiff, and for each of the first and second switching drivers 401-1 and 401-2, the respective drive voltage Vx (i.e. the average voltage at the driver output over the duty cycle), the switching voltages SW and the duty cycle DC (in terms of proportion of time spent at the high-side switching voltage). Table 2 also illustrates the resulting common-mode voltage VCM of the first and second driver signals. Note that the reference to the common-mode voltage or common-mode voltage component refers to the average common-mode voltage component of the drive signals, i.e. determined over a full switching cycle. It will be understood that during the cycle, there may be some common-mode ripple depending on the timing of switching between the switching voltages on either side of the load.

TABLE 2

| | First Driver 401-1 | | | Second driver 401-2 | | | |
|---|---|---|---|---|---|---|---|
| Vdiff | Vx1 | SVs | DC | Vx2 | SVs | DC | VCM |
| 12 | 16 | 20/0 | 80% | 4 | 20/0 | 20% | 10 |
| 14 | 17 | 20/0 | 85% | 3 | 20/0 | 15% | 10 |
| 16 | 18 | 20/0 | 90% | 2 | 20/0 | 10% | 10 |
| 16 | 22 | 40/20 | 10% | 6 | 20/0 | 30% | 14 |
| 18 | 23 | 40/20 | 15% | 5 | 20/0 | 25% | 14 |
| 20 | 24 | 40/20 | 20% | 4 | 20/0 | 20% | 14 |
| 22 | 25 | 40/20 | 25% | 3 | 20/0 | 15% | 14 |
| 24 | 26 | 40/20 | 30% | 2 | 20/0 | 10% | 14 |
| 24 | 22 | 40/20 | 10% | −2 | 0/−20 | 90% | 10 |

Figure 2:
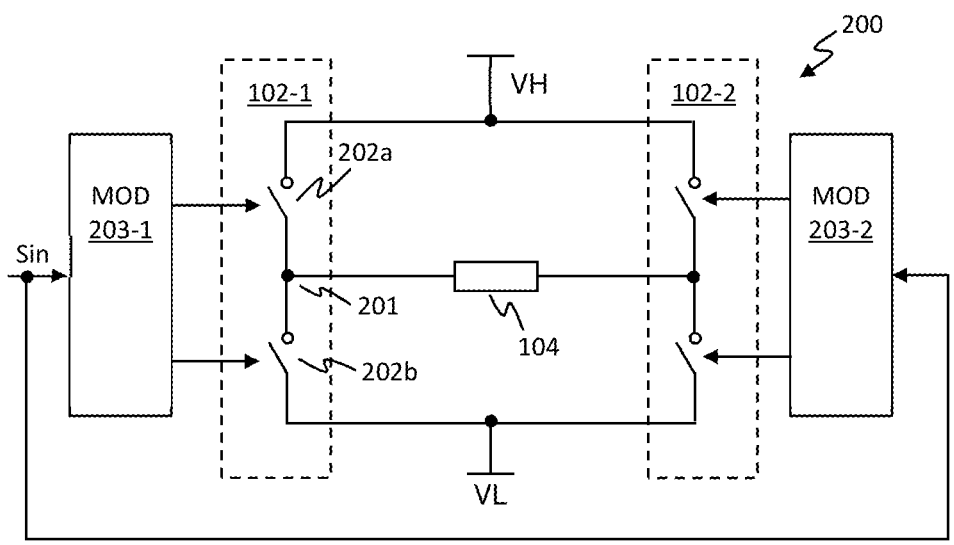
FIG. 2 illustrates one example of a driver circuit for driving a load in a bridge-tied-load configuration.

In the example of FIG. 2, the duty cycle of each of the switching drivers may be controllably varied with minimum and maximum duty cycle limits of 10% and 90%. It can be seen that, in this example, a differential voltage of up to 16V can be generated by operating in the low-signal level BTL mode, i.e. with both switching drivers operating in the first driver mode with valid duty cycles in the range of 10% to 90%. In this example the duty cycles of the switching drivers, in the low-signal level BTL mode, are controlled to vary equally and oppositely about a duty cycle of 50% and thus the common mode voltage is equal to 10V.

At the differential output of 16V the duty cycle of the first switching driver 401-1 is at the maximum duty cycle limit of 90% and cannot be increased further, and likewise the second switching driver 401-2 is at the minimum duty cycle limit of 10%. When the duty cycle limit is reached, the controller transitions the first switching driver to operate in the second driver mode, with switching voltages of 20V and 40V, and sets the duty cycle for the first switching driver to the minimum duty cycle limit. At the minimum valid duty cycle, in this example 10%, the voltage of the first driver signal is thus 22V. To provide the correct differential voltage of 16V, the operation of the second switching driver is maintained in the first driver mode, but the duty-cycle carried to provide a second drive signal with a voltage of 6V, which, in this example, involves operating with a duty cycle of 30%. The controller thus effectively transitions from the low signal level BTL mode of operation to the intermediate signal level BTL mode of operation by transitioning the driver mode of operation on one side of the load (whilst maintaining the driver mode on the other side of the load) and maintains the same differential voltage across the load when transitioning. This does however result in the common-mode component of the first and second drive signals increasing to 14V.

If the required differential output Vdiff increases further, the duty cycle of the first switching driver 401-1 may be increased, with the duty cycle of the second switching driver 401-2 being correspondingly reduced, i.e. the duty cycles may be varied equally and oppositely, which maintains the common-mode voltage at a substantially constant value (14V in this example) when operating in the intermediate signal level BTL mode. The duty cycles may be varied until the duty cycle of the second switching driver 401-2 reaches the minimum limit of 10%, which in this example occurs for the differential output voltage of 24V.

At this point, the mode of operation of the second switching driver 401-2 may be changed to the third driver mode, with switching voltages of −20V and 0V, and the duty cycle of second switching driver set to the maximum duty cycle limit, which in this example is 90% which provides a driver voltage Vx from the second driver of −2V. To provide the desired differential voltage of 24V, first switching driver 401-1 may continue to operate in the second mode and the duty cycle controlled to provide a voltage for the first drive signal of 22V, which in this case corresponds to the minimum duty cycle of 10%. Thus the controller 1201 effectively transitions to the high-signal level BTL mode of operation. This provides the desired differential output and also returns the common-mode voltage to 10V.

Further increases in the differential output voltage Vout can then be achieved by continuing to operate in the high-signal level BTL mode, with the first switching driver 401-1 in the second driver mode and the second switching driver 401-2 in the third driver mode, and increasing the duty cycle of the first switching driver whilst decreasing the duty cycle of the second switching driver. Applying equal and opposite changes to the duty cycle will maintain the common-mode voltage at 10V.

It should be understood that the duty cycle limits of 10% and 90% are just an example and other limits could be implemented.

Operating in this way, with a variation or jump of the common-mode voltage, which may be referred to as operating with a bumped common-mode, thus allows voltages around 20V (in this example) to be achieved with valid duty cycles.

Figure 13:
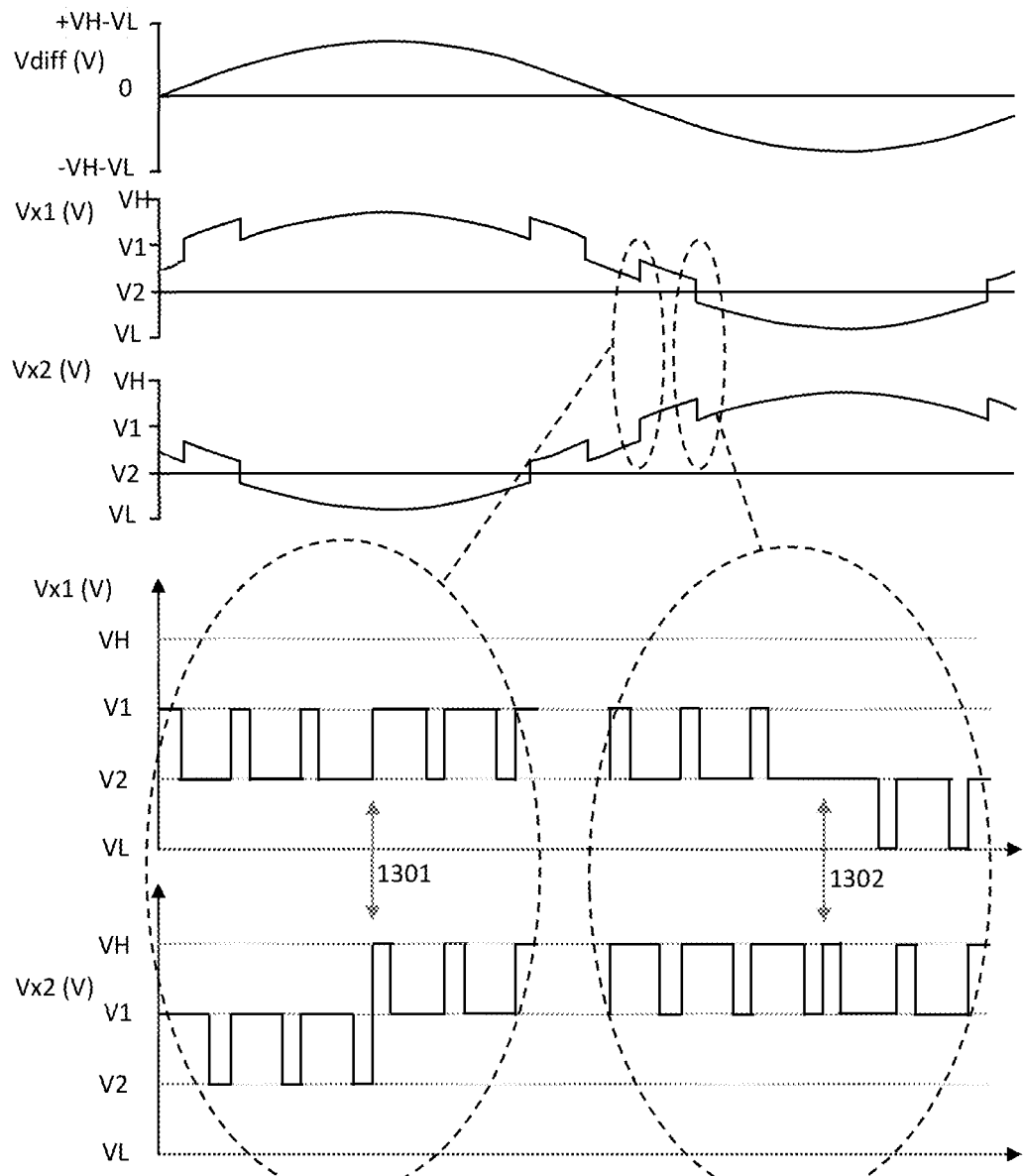
FIG. 13 illustrates example waveforms for the drivers on each side of the load and the resultant differential voltage for a bridge-tied load configuration.

FIG. 13 illustrates some example voltage waveforms to illustrate this principle. FIG. 13 illustrates, in the second and third waveforms from the top, the voltages Vx1 and Vx2 of the drive signal at the respective driver output nodes (in terms of the average voltage over the course of a duty cycle). FIG. 13 also illustrates, in the top waveform, the resultant differential voltage Vdiff across the load. The lower two waveforms illustrate the switching waveforms at the respective driver output node, for parts of the waveforms illustrated in the top plots, and illustrate how the switching voltages and duty cycles may vary across a mode transition.

In this example, each of the switching drivers 401-1 and 401-2 is operable in three modes, similar to those discussed above with reference to FIG. 3. FIG. 13 illustrates the example where the differential output voltage, which depends on the relevant input signal, varies positively and then negatively with a relatively high amplitude.

FIG. 13 illustrates that initially the required differential voltage across the load is zero, and both the switching drivers operate to provide the same quiescent voltage level, which in this case is a midpoint voltage between V1 and V2. Both switching drivers 401-1 and 401-2 may thus operate in the first mode switching between switching voltages V1 and V2, i.e. the low-signal BTL mode, and both switching drivers may each initially operate with a duty cycle of 50%. As the required differential voltage increases, the duty cycle of the first switching driver 401-1 is increased, with an equal and opposite change to the duty cycle of the second switching driver 401-2, so the driver voltages Vx1 and Vx2 vary equally and oppositely.

As the required differential voltage Vdiff increases, the first switching driver 401-1 transitions to operating in the second mode, with switching voltages of VH and V1. As discussed above, however, it may not practically be possible for the switching driver to operate with a duty cycle that goes as high as 100% or as low as 0%. Thus the duty-cycle of the first switching driver will go from a duty cycle less than 100% in the first mode to a duty-cycle greater than 0% in the second mode. As such the average of the drive voltage Vx1 (over the course of the switching cycle) jumps from a value below V1 to a value above V1. The same jump in voltage is thus applied to the driver voltage Vx2 of the second switching driver 401-2 to maintain the correct differential voltage. The second switching driver 401-2 thus continues to operate in the first mode and the system operates in the intermediate signal level BTL mode.

As the required differential voltage Vdiff increases further, the second switching driver transitions to the third mode, with switching voltages of V2 and VL, to provide the high-signal level BTL mode. Again, the practical duty cycle limits result in a jump in the voltage Vx2 across the transition, and thus a corresponding voltage jump is applied to Vx1 to maintain the correct differential voltage Vdiff.

FIG. 13 also illustrates that similar jumps may apply when transitioning back to the intermediate signal level BTL mode and then the low-signal level BTL mode and also for the negative part of the cycle.

FIG. 13 also illustrates examples of the switching waveforms across two of the mode transitions. In the first case, both switching drivers are initially operating in the first mode with switching voltages V1 and V2, and then at a time illustrated by arrow 1301, the second switching driver transitions to the first mode, with switching voltage VH and V1, i.e. to the BTL intermediate signal level mode for a negative differential voltage. Just before the transition the output node of the second switching driver 401-2 is switching between the switch voltage V1 and V2 with a duty cycle at a defined duty cycle maximum. After the transition, illustrated by arrow 1301, the output node of the second switching driver switches between the voltages VH and V1, with a minimum duty cycle. The output node of the first switching driver 401-1 continues to switch between the voltages V1 and V2, but the duty cycle is increased across the arrow 1301.

The second case illustrates the transition to the high-signal level BTL mode of operation, where the first switching driver transitions 1302 to the third driver mode with switching voltage V2 and VL and an increase of duty cycle from minimum to maximum and the second switching driver continues to switch between the voltages VH and V1 but with a reduced duty cycle.

Figure 14:
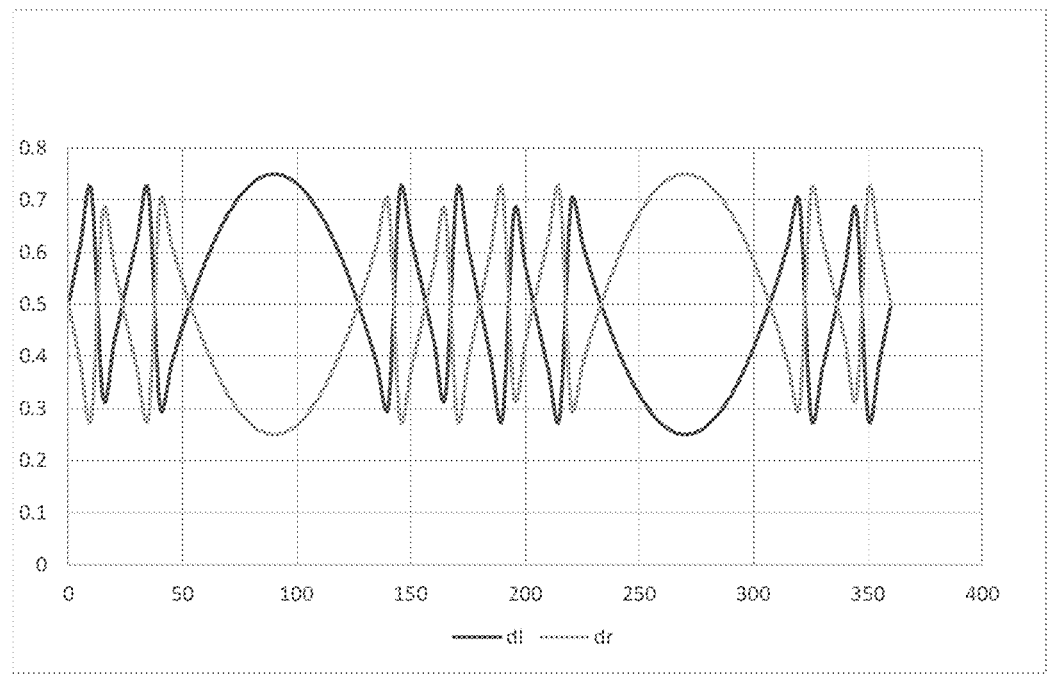
FIG. 14 illustrates how the duty-cycles of the switching drivers on each side of the load may vary for the differential waveform illustrated in FIG. 13.

FIG. 14 illustrates how the duty cycle of the switching drivers may vary on each side of the load to provide a differential output waveform such as illustrated in the top plot FIG. 13, in this example where the maximum and minimum duty cycles are 75% and 25% respectively.

It will also be noted that, as in this example, where the high switching voltage in the first driver mode is the low switching voltage in the second driver mode, and the difference between the switching voltages are the same in each of the modes, then changing from the first driver mode to the second driver mode can be considered mathematically the same as adding an additional 100% to the duty cycle in the first mode. In other words a change from 90% duty cycle in the first driver mode to 10% duty cycle in the second driver mode, can be considered to be mathematically the same as an increase from 90% to 110% for the switching voltages of the first driver mode. This change can thus be seen as increase in duty cycle of 20%, and thus to maintain the same differential voltage on such a mode transition, an equivalent change in duty cycle is made to the other driver, i.e. an increase in duty cycle from 10% to 30%. In other words, the magnitude of a change in duty cycle applied to both drivers equals 100%, that is if the duty cycle of the first driver is reduced from 90% to 10% on a mode change, which represents a change in duty cycle of 80%, the corresponding change in duty cycle applied to the second driver is 20%.

It should also be noted that defined maximum and minimum limits for the purposes of a mode transition need not be the same as a practically achievable duty cycle limit. For instance, it may in some cases be advantageous to swap between a maximum duty cycle of 75% and a minimum duty cycle of 25%. This particular combination means that the change in duty cycle on each side of the load over a transition is 50% and on each transition the duty cycle on one side of the load transitions from 75% to 25% and the duty cycle on the other side of the load transitions from 25% to 75%. This can be advantageous in terms of minimising discontinuities on mode transition.

The controller can therefore be seen as implementing three BTL modes of operation, (i) a low-signal level BTL mode, with both drivers operating in the first driver mode to provide a mid-range voltage; (ii) an intermediate signal level BTL mode with one driver operating in the first driver mode and the other driver operating in the second or third driver mode to provide a high (relatively positive) or low (relatively negative) range voltage; and (iii) a high-signal level BTL mode with one driver operating in the second driver mode to provide a high (positive) voltage range and the other driver operating in third driver mode to provide a low (negative) voltage range. The controller may operate in a given mode and controllably vary the duty cycle of both drivers within defined maximum and minimum limits of duty cycle. The controller may control the duty cycles to vary with input signal level within the limits, so that a common-mode component does not substantially vary with signal level in a given operating mode. If required, the controller may transition between modes, where each transition involves changing the driver mode, i.e. the switching voltages, on one side of the load only. This, if the input signal changes increase say the controller may transition from the low-signal level BTL mode to the intermediate signal level mode by changing the switching voltages on one side of the load and then, if the input signal continues to increase, later transition to the high-signal level mode by changing the driver mode on the other side of the load.

The controller may be configured so that the common-mode component of the first and second driver signals is substantially the same in the low-signal level BTL mode and the high-signal level BTL mode, which may correspond to a midpoint voltage between the switching voltages used in the first driver mode. The common-mode component may be different when operating in the intermediate signal level BTL mode.

In general therefore, the controller may be configured to implement a transition in mode of one of the switching drivers, from the present driver mode to a new driver mode, by initially controlling the switching driver (undergoing the mode change) to operate in the current driver mode with a first duty cycle, whilst controlling the other switching driver with a second duty cycle. The controller may then transition the relevant switching to operate in the new driver mode (with different switching voltages) with a modified duty cycle and may also modify the duty of the other switching driver to maintain the same differential voltage across the transducer. The controller may, in particular, be configured to transition between different driver modes of operation when the duty cycle of at least one of the first and second switching drivers reaches a maximum or minimum duty cycle limit. The controller may implement the transition by changing the driver mode of one of the first and second switching drivers at said maximum or minimum limit of duty cycle and vary the duty cycle of that one of the first and second switching drivers to the other limit of duty cycle (i.e. from maximum to minimum of vice versa) whilst maintaining the driver mode of the other of the first and second switching drivers and applying a variation in duty cycle to maintain a magnitude of a differential component of the first and second driver signal.

Note, similar principles could be applied to a driving circuit for driving a load in a single ended configuration, if the DC voltage on the other side of the load could be controllably varied, so as to avoid discontinuous in the drive signal applied to the load due to switching driver being unable to achieve a duty cycle (i.e. modulation index) of 100% or 0%.

Figure 15:
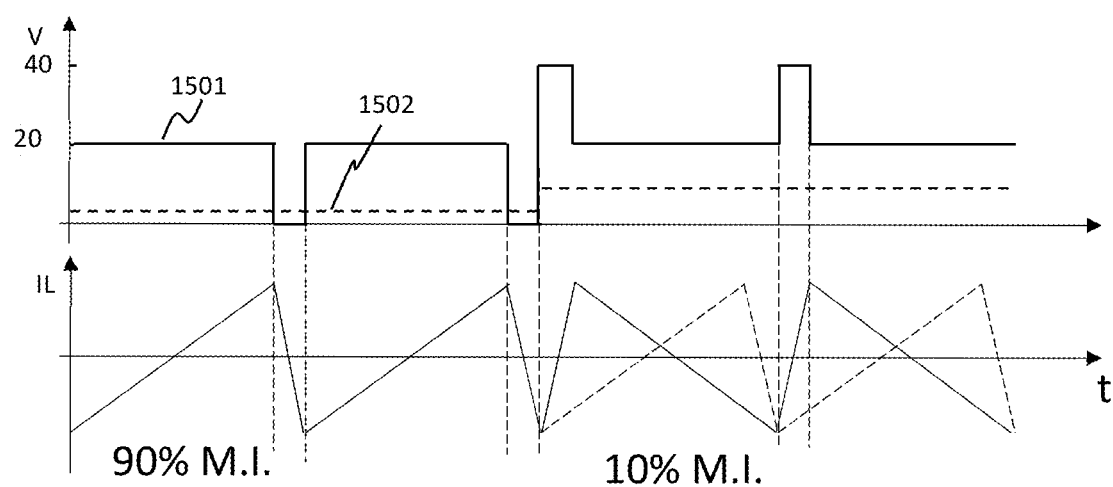
FIG. 15 illustrates example waveforms for a mode transition for a single-ended driver.

For example, consider that a switching driver is configured to drive one side of a load in a single ended configuration and is operable in a first mode with switching voltages 0V and 20V, and a second mode with switching voltages of 20V and 40V. Whilst operating in the first mode, the voltage on the other side of the load may be held at a first DC value, say 2V purely as an example. The duty cycle of the switching driver may be controllably varied within a range up to a defined limit, which could, for example, be a duty cycle or modulation index of 90%, which could lead to a voltage for the drive signal from the switching driver of 18V, leading a voltage of 16V across the load. To transition between modes of operation, to allow for higher voltages to be applied, the switching driver may initially be operated in the first mode at a duty cycle of 90%, and then switched to operate in the second mode with a duty cycle of 10%. At the same time, the DC voltage on the other side of the load may be increased to 6V. FIG. 15 illustrates the relevant switching waveform 1501 for the output node of the switching driver and the voltage 1502 on the other side of the load for such a transition and the load current. It will be seen that by changing the duty cycle or modulation index from 90% to 10% and also changing the DC voltage, the volt-second balance is maintained as well as the differential voltage.

In a bridge-tied-load configuration, where both sides of the load are driven by a switching driver, second order effects can appear. The inductor current matches the output-based duty cycle and discontinuity of charge transfer can occur.

Figure 16:
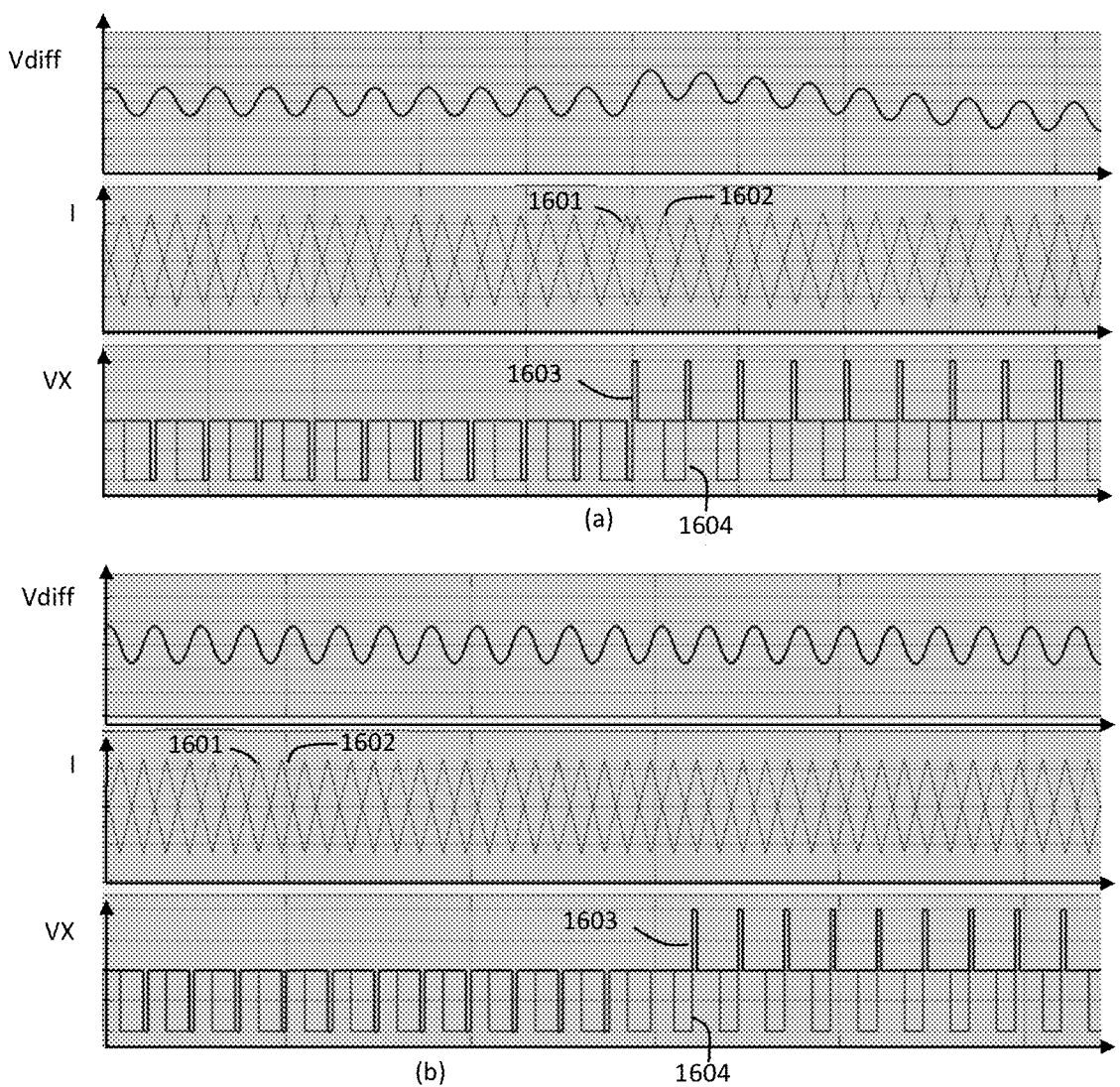
FIG. 16 illustrates one example of waveforms for a driver circuit for driving a bridge-tied-load.

FIG. 16 illustrates some example waveforms for driver circuitry comprising first and second switching drivers according to embodiments of the disclosure and illustrates a mode transition for the switching voltages for the first switching driver. FIG. 16 illustrates two sets of waveforms, (a) and (b) in each case showing the differential output voltage Vdiff, the first and second output currents 1601 and 1602 for the first and second switching drivers respectively and the voltages 1603 and 1604 at the output nodes for the first and second switching drivers respectively during a mode transition.

In the top set of waveforms (a), it can be seen that the first switching driver is initially operating with the same switching voltages as the second switching driver. It can be seen that the duty cycle for the first switching driver is relatively high, i.e. the relevant drive voltage is near the maximum for the driver mode of operation. The driver mode of operation for the first switching driver then changes, and it starts switching between the previous high voltage and a higher boosted voltage, but now with a relatively short duty cycle. It can be seen that, in this example, the change to the switching voltages and resultant change in duty cycle results in a disturbance in the current waveforms, with a consequent disturbance in the output voltage.

In some implementations this can be mitigated by a controlled variation in the switching timing. The lower set of waveforms (b) show a similar transition, but the timing of switching to the high-side voltage in the second mode is controlled to occur at a suitable point which does not result in any significant disturbance in the current waveforms.

At the point of a mode transition the switching voltages on one side of the load vary and there is a change in duty cycle on both sides of the load. This can result in the pattern of load current flow changing as discussed with reference to FIG. 16. In particular there may be a reversal of load current ramping at the point of switching which results in a discontinuity in load current. The mode transitions may therefore be implemented to avoid an unwanted discontinuity in load current. This may, in some examples, be achieved by applying a phase shift to a PWM carrier waveform used to generate the PWM control signals for the output stages of the switching drivers. The phase shift may be based on the amount of change in duty cycle.

Generally the duty cycles for the drivers on both sides of the load may be generated by a modulator by comparing a modulator input with a carrier waveform, which will generally be a sawtooth or triangular waveform. The input to the modulator is based on, or derived from the input signal, possibly with some adjustment to reflect the operating mode of the switching drivers—and generally the modulator input for driving one side of the load is an inverted version of the modulator input for driving the other side of the load. The modulator compares the relevant input to the carrier waveform and generates the PWM control signal.

Figure 17:
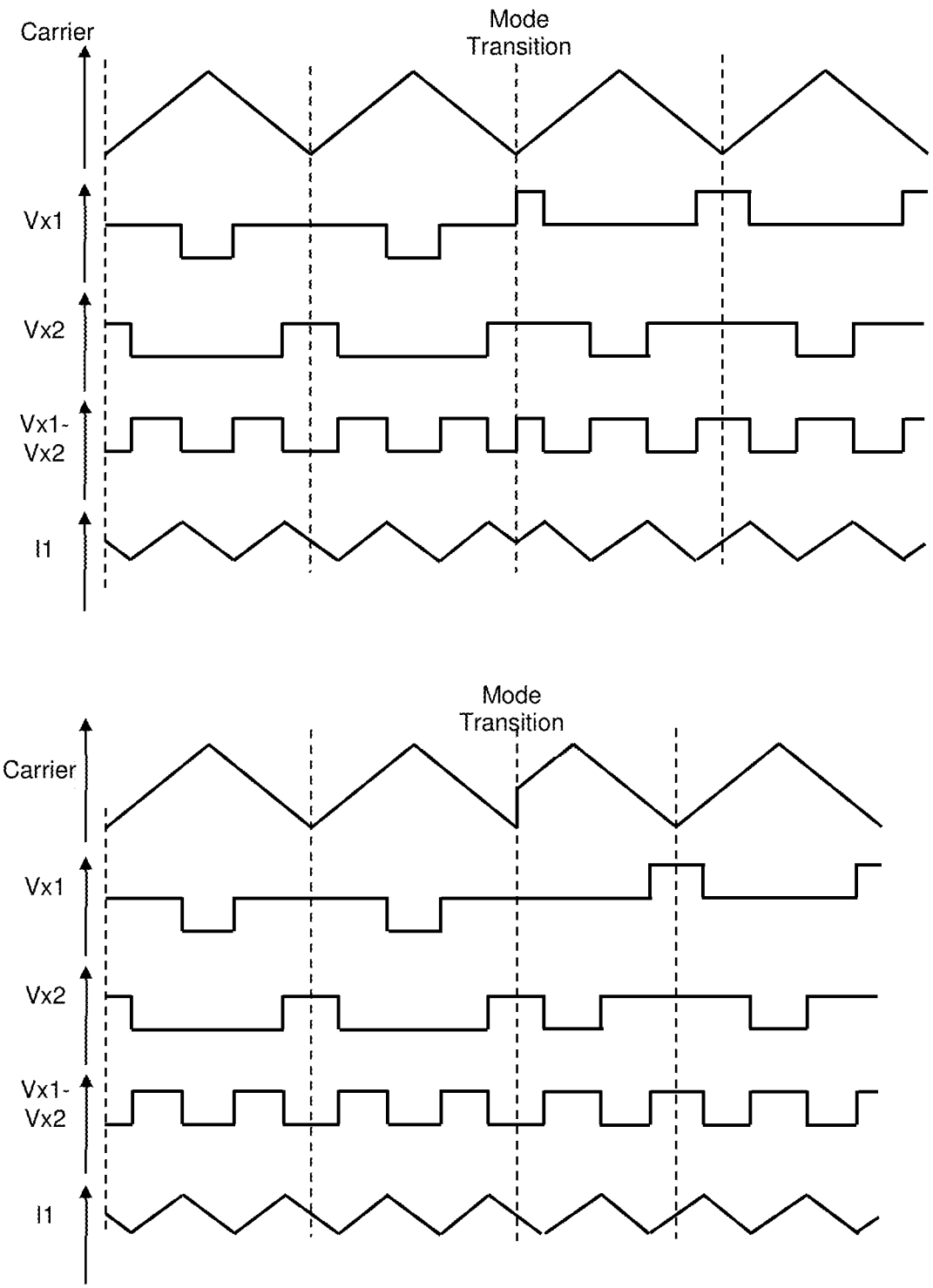
FIG. 17 illustrates examples waveforms across a mode transition.

FIG. 17 illustrates two sets of example waveforms and how the timing may be controlled on a mode transition. FIG. 17 illustrates a carrier waveform, in this example a sawtooth waveform that ramps up and down over the course of a switching cycle. FIG. 17 also illustrates the voltages Vx1 at the output of the first drivers and Vx2 at the output of the second driver and also the difference Vx1-Vx2 and the resulting load current from the first switching driver.

FIG. 17 illustrates four switching cycles and illustrates an example where, for the first two cycles, both of the first and second switching drivers are operating in the first driver mode. In this example, both drivers output the relevant high switching voltage at the start of a switching cycle and then switch to the low switching voltage when the carrier waveform reaches the value of the relevant input. In the illustrated example the first driver has a relatively high duty cycle and the second driver has a relatively low duty cycle. This results in periods of high and low differential voltage across the load and the current IR from the first driver ramping up and down accordingly, with the relevant periods depending on the respective duty cycles. It will be noted that in this example the load current ramps down at the end of one switching period and start of another, when both drivers are outputting the same high switching voltage.

The top set of waveforms illustrates that the first switching driver transitions to the second driver mode of operation at the end of the second switching cycle. Now, at the start of the switching cycle, the first driver is outputting the high switching voltage for the second driver mode, which is higher than high switching voltage that is output by the second driver. This results in a relatively high differential voltage across the load and results in change in the load current slope which results in a discontinuity. As a result of the change in mode, the first driver now operates with a relatively low duty cycle and the duty cycle of the second driver is increased to maintain the correct differential voltage.

The lower set of waveforms illustrates similar operation for the first two switching cycles, but in this case at the point of mode transition there is a phase shift to the PWM carrier. In particular the carrier is phase shifted to an extent such that the output of first switching driver is at the new low switching voltage. This keeps the voltage Vx1 of the first switching driver at the same level across the mode transition and avoids a change in slope of load current. The voltage Vx2 of the second switching driver will then later switch to the low switching voltage when the carrier reaches the appropriate level. For a sawtooth waveform, the phase shift applied (in terms of percent of the cycle period) may correspond to the shift in duty cycle divided by two, i.e. if the change in duty cycle were for example 40%, the phase shift may correspond to a time shift of 20% of the switching period. This maintains the same load current profile during the mode transition and avoid discontinuity.

In embodiments of the disclosure, the controller may thus be configured to control the first and second switching drivers such that there is no substantial change in slope of load current from a driver output node at the point of a mode transition. The controller may be configured, on a change in driver mode, to vary an amount of a mode correction applied to the modulator input by an amount related to the magnitude of the voltage range of the new operating mode. The controller may be configured to apply a phase shift to a PWM carrier waveform on a mode transition. The phase shift applied may be based on the amount of change in duty cycle (applied to the switching driver which is not changing driver mode). When the carrier waveform is a sawtooth waveform, that ramps from a minimum value to a maximum value and back to the minimum value over the course of a cycle period, the controller may be configured such that the phase shift applied to the carrier waveform is proportion of the cycle period that corresponds to half the change in duty cycle for the second switching driver.

In some implementations BD-modulation techniques can be used to manage the discontinuity by switching between points of equivalent ripple. That is, the switching of the first and second switching drivers may be asynchronous and the output of both of the switching drivers may be connected to the relevant high-side voltage or low-side voltage simultaneously for at least part of the switching cycle.

The amount of ripple in the output from a switching driver will vary over time depending on the duty cycle of switched mode driver and the peak-to-peak ripple will thus vary with duty cycle of the switching driver.

Figure 18:
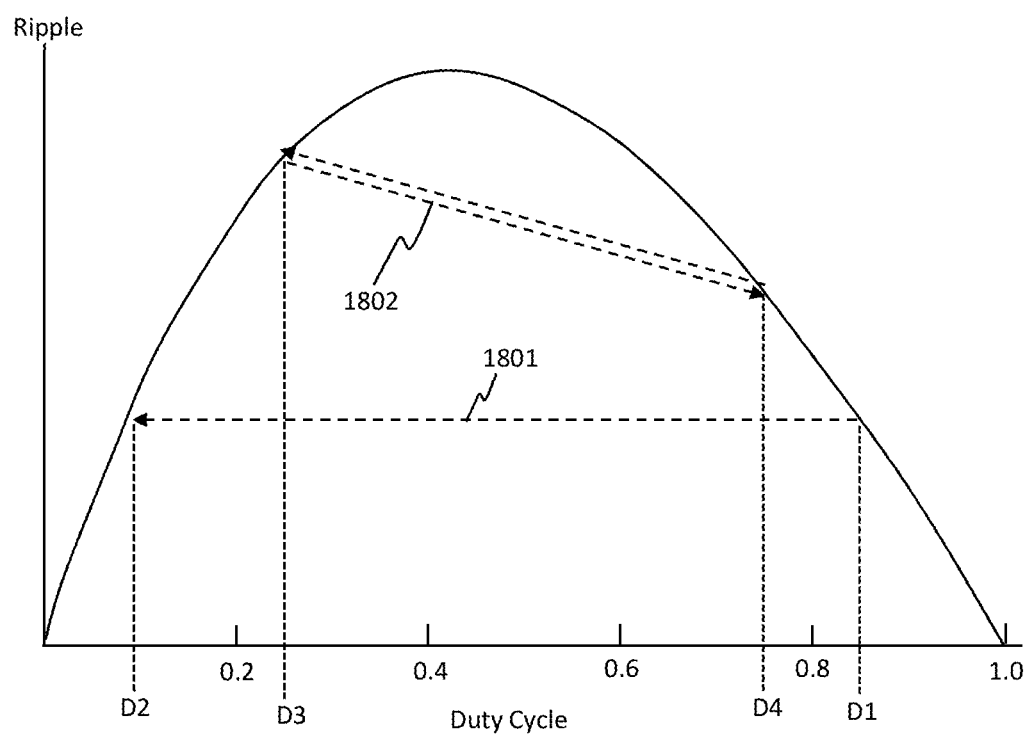
FIG. 18 illustrates one example duty cycle of the switching drivers may be controllably varied to manage discontinuities.

FIG. 18 illustrates one example of how the peak-to-peak ripple may vary over the range of duty cycles from 0 (i.e., 0%) to 1 (i.e. 100%). To reduce the extent of any discontinuity as a result of a mode transition, the transition may be implemented so that the duty cycles of the switching drivers vary but maintain a substantially equal amount of ripple.

This could be implemented in different ways. In a first approach, the duty cycle of a switching driver could be changed from a first duty cycle D1 to a second duty cycle D2, where the duty cycles D1 and D2 exhibit substantially the same peak-to-peak ripple as one another. This is illustrated by transition 1801 in FIG. 18 which indicates that the duty cycle of the switching driver could be varied from a first duty cycle D1 to a second duty cycle D2, the first and second duty cycles being selected to provide equal amounts of ripple.

In a second approach, the duty cycles of both switching drivers could be changed so that the amount of ripple seen differentially across the load stays constant. For instance, as illustrated by transition 1802 in FIG. 15, the duty cycle of the first switching driver could be varied from a first duty cycle D3 to a second duty cycle D4, say from 25% to 75%, whilst the duty cycle of the second switching driver is changed from D4 to D3, e.g. from 75% to 25%. In general the duty cycles of the first and second switching drivers may thus be varied so that an amount of ripple due to the duty cycle of the first switching driver before the transition is the same as an amount of ripple due to the duty cycle of the second switching driver after the transition and vice versa.

In general, therefore, embodiments of the present disclosure relate to switching drivers which are suitable for driving an output transducer, that are operable to provide a drive signal with an average voltage within a defined output voltage range, e.g. between a low voltage VL and a high voltage VH. The switching driver is operable in a plurality of different driver modes, wherein in each of the modes a driver output node is switched between two switching voltages with a controlled duty cycle, wherein the switching voltages are different for each mode and the switching voltages in each mode provide only part, i.e. a subset, of the defined output voltage range.

The different switching voltages in the different driver modes may define non-overlapping voltage ranges, however this need not be the case, and, in some embodiments, there could be some overlap between the voltage ranges. For instance, the switching voltages in a first driver mode could be V1 and V2 and in a second driver mode one of the switching voltages may be a voltage which is between V1 and V2. For example the switching voltages may be 0V and 20V in a first driver mode and say 16V and 26V in a second driver mode.

In at least some embodiments the switching driver may comprise at least variable boost stage having first and second inputs for receiving high-side and low-side input voltages and comprising a network of switching paths and connections for a capacitor. The variable boost stage may thus be a switched capacitor stage.

The switched capacitor converter stage may implement a boost function as needed. When used for driving reactive loads, such as a piezo transducer, a relatively large capacitor can provide the charge needed with one charge pumping cycle.

The variable boost stage controls the switching voltages supplied to a switching output stage. The output stage, for instance, be controlled as a Pulse-Width Modulation (PWM) output stage. In some implementations the PWM stage may drive the load in series with an inductor, which allows lossless movement of charge between load and capacitor of the switched capacitor variable boost stage for charge recovery.

A driver circuitry according to at least some embodiments may thus be seen as a hybrid, e.g. capacitive and inductive, driver circuit.

The driver circuitry is configured to have floating supply domains, i.e. variable switching voltages in different operating modes, which allows for the switches of the driver circuit to have a relatively low Vdsmax (drain-source voltage tolerance). The driver circuit may be configured such that the MOSFET well-to-substrate breakdown voltages are sufficiently high for the peak output voltages generated in use.

A first boost converter may provide boosting from a supply voltage, such as a battery voltage to an intermediate supply VBST for input to the variable boost stage.

At least some of the embodiments described above relate to a hybrid (e.g. capacitive and inductive) driver for a reactive (e.g. piezoelectric) load, where driver comprises: a charge pump, a PWM driver, and a control system arranged to maintain linearity while transitioning the charge pump states.

The driver may be operable to produce N times the peak-to-peak output voltage, which can be N times the Vds breakdown voltage of the devices by driving the deep N-wells in a signal dependent manner (where N=6, for example).

At least some embodiments relate to a hybrid driver for a reactive load such as a piezoelectric transducer, where the driver is arranged to receive an input signal and to generate an output signal for driving the reactive load, the hybrid driver comprising: a driver stage, which may, for example, be a Pulse-Width-Modulation (PWM) driver, the driver stage arranged to receive the input signal and to generate the output signal for driving a reactive load. The driver may also comprise a variable boost stage, such as a charge pump stage, arranged to generate a voltage supply range for the driver stage based on a supply voltage, and the charge pump stage may be controlled such that the voltage supply range is based on the range of the received input signal.

The driver may further comprise a first defined boost stage or power converter stage, e.g. a DC/DC Boost Converter, the power converter stage arranged to receive a supply voltage and to generate a boosted supply voltage, wherein the charge pump stage generates the voltage supply range based on the boosted supply voltage. The supply voltage may be from a battery or other power source.

The charge pump stage may comprise at least one capacitor, wherein the capacitor size is selected based on the reactive load to be driven, such that a single charging cycle of the capacitor provides sufficient charge for the driving of the reactive load.

Preferably, the driver stage drives an inductor arranged in series with the reactive load, wherein the inductor allows lossless movement of charge between the load and a supply capacitor for charge recovery.

The hybrid driver may be implemented in a single-ended configuration. The hybrid driver may alternatively be implemented in a bridge-tied-load (BTL) configuration, to drive opposite terminals of the reactive load. For a BTL configuration, it will be understood that the hybrid driver comprises complimentary charge pump and driver stages for either side of the load.

In at least implementations, the hybrid driver may comprise switching devices, preferably MOSFETs. In one example, N-type MOSFETs are used as the switching devices. In an alternative example, a mixture of N-type and P-type MOSFETs are used.

Preferably, the switching devices are at least partly controlled based on the signal range of the output signal. In some implementations, wells of the switching devices, e.g. deep N-wells, are driven based on the signal range of the output signal. By driving the deep N-wells of the MOSFETs, it is possible to avoid P-well to deep N-well breakdown, or forward biasing of the deep N-well to the substrate or P-well of the devices. Accordingly, the peak-to-peak output voltage of the hybrid driver can be a multiple of the Vds breakdown voltage of the devices used.

The charge pump stage may be arranged to select a voltage supply range to be generated from a plurality of supply ranges. In some example, the charge pump stage is arranged to select between 0-20V, 20-40V, or −20-0V voltage ranges.

The hybrid driver may be controlled to apply a common mode jump to linearize the range transition. When driving the load differentially, the hybrid driver controls both the differential and the common mode voltage in order to keep both of the differential outputs in valid operating ranges and thus avoid distortion and artefacts during range transitions of the charge pump.

In some implementations, for an asymmetric differential configuration consisting of one hybrid driver and a DC source, the driver is controlled to vary the modulation index of the driver while adjusting a DC source applied to the opposite side of the reactive load to eliminate discontinuities between charge transfer phases of the charge pump stage.

For a BTL configuration, the charge pump stages of the driver may be controlled to eliminate discontinuities between charge transfer phases of the charge pump stages, for example by applying a BD-modulation to the switching of the charge pump stages.

There is further provided a control method for a driver, preferably for driving a reactive load such as a piezoelectric transducer, the driver comprising a plurality of MOSFET switching devices, the method comprising the steps of: receiving an input signal, and generating an output signal based on the received input signal, the output signal at least partly generated by switching of the MOSFET switching devices, wherein the method comprises the further step of: driving the wells of the MOSFET switching devices based on the signal range of the output signal, to prevent breakdown or forward biasing of the MOSFET switching devices.

The driver may be a hybrid driver comprising inductive and reactive elements.

The driver may comprise a set of high-voltage switches, and the step of driving the wells may comprise operating the high-voltage switches synchronously to the charge-pump during large signals.

There is also provided a system for driving a reactive load such as a piezoelectric transducer, the system comprising: a driver stage to receive an input signal and to generate an output signal for driving a reactive load, a charge pump stage arranged to generate a voltage supply range for the driver stage based on a supply voltage, and an inductor element to be arranged in series with the reactive load such that the driver stage drives the inductor element, wherein the inductor element allows lossless movement of charge between the load and a supply capacitor for charge recovery.

It will be understood that the driver stage and charge pump stage may be provided by a hybrid driver as described above.

Embodiments also relate to driver circuitry comprising two switching drivers configured to provide output drive signals for driving a bridge-tied-load.

As mentioned, the switching driver may be suitable for driving an output transducer. The output transducer may be, in some implementations, be an audio output transducer such as a loudspeaker or the like. The output transducer may be a haptic output transducer. In some implementation the output transducer may be driven in series with an inductor, i.e. there may be an inductor in an output path between an output node of the switching driver and the load. In some implementations the transducer may be a piezoelectric or ceramic transducer.

Embodiments may be implemented as an integrated circuit. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

The skilled person will recognise that some aspects of the above-described apparatus and methods, for instance aspects of controlling the switching control signals to implement the different modes, may be embodied as processor control code, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A driver apparatus for driving a transducer in a bridge-tied-load configuration between first and second driver output nodes with a differential drive signal based on an input signal, the driver apparatus comprising:
    a first switching driver for switching the first driver output node between a first set of switching voltages;
    a second switching driver for switching the second driver output node between a second set of switching voltages;
    wherein at least the first switching driver is operable in different driver modes in which the first set of switching voltages is different in the different driver modes; and
    a controller configured to control a duty cycle of the first switching driver and a duty cycle of the second switching driver by comparing a carrier signal with at least one modulator input signal that varies with the input signal;
    wherein, on a change of driver mode of the first switching driver, the controller is configured to adjust an offset applied to the at least one modulator input signal and also apply a phase shift to the carrier waveform.

2. The driver apparatus of claim 1 wherein the second switching driver is also operable in different driver modes in which the second set of switching voltages is different in the different driver modes.

3. The driver apparatus of claim 1 wherein the apparatus is configured to transition between said first switching driver between said driver modes from a present mode to a new mode by varying the first set of switching voltages without any change to the second set of switching voltages and the controller is configured to vary the duty cycles of the first and second switching drivers such that a differential voltage across the transducer over the course of a switching cycle is substantially the same before and after the transition.

4. The driver apparatus of claim 3 wherein, on said transition of the first switching driver from the present mode to the new mode, the controller is configured to vary the duty cycle of the first switching driver by a first duty cycle amount and to vary the duty cycle of the second switching driver by a second duty cycle amount, wherein the magnitude of the first duty cycle amount added to the magnitude of the second duty cycle amount corresponds to a duty cycle of 100%.

5. The driver apparatus of claim 3 wherein the controller is configured to operate the first switching driver in a selected driver operating mode with a duty cycle within predetermined maximum and minimum limits of duty cycle and is configured to transition from the present mode to the new mode when the relevant duty cycle limit is reached.

6. The driver apparatus of claim 5 wherein the controller is configured to, when the relevant maximum or minimum duty cycle limit is reached for the present mode, to transition to the new mode and to control the first switching driver to operate at the minimum or maximum duty cycle limit respectively in the new mode.

7. The driver apparatus of claim 6 wherein the maximum duty cycle limit is 75% and the minimum duty cycle limit is 25%.

8. The driver apparatus of claim 3 wherein the controller is configured to control the first and second switching drivers such that there is substantially no change in ramp direction in load current from the first driver output node at the point in time in which the controller varies the first set of switching voltages.

9. The driver apparatus of claim 3 wherein the second switching driver is also operable in different driver modes in which the second set of switching voltages is different in the different driver modes and the apparatus is configured to transition said second switching driver between said driver modes from a present mode to a new mode by varying the second set of switching voltages without any change to the first set of switching voltages and the controller is configured to vary the duty cycles of the first and second switching drivers such that a differential voltage across the transducer over the course of a switching cycle is substantially the same before and after the transition.

10. The driver apparatus of claim 1 wherein, the controller is configured, on a change in driver mode of the first switching driver, to vary an amount of a mode correction applied to said at least one modulator input signal by an amount related to the switching voltages of the new operating mode.

11. The driver apparatus of claim 1 wherein said phase shift applied to the carrier waveform is based on an amount of change in duty cycle for the second switching driver.

12. The driver apparatus of claim 11 wherein the carrier waveform is a triangle waveform that ramps from a minimum value to a maximum value and back to the minimum value over the course of a cycle period, and wherein the controller is configured such that said phase shift applied to the carrier waveform is a proportion of the cycle period that corresponds to half the change in duty cycle for the second switching driver.

13. The driver apparatus of claim 1 further comprising at least a first inductor connected to the first driver output node for connection in series with the transducer.

14. The driver apparatus of claim 1 wherein the transducer is at least one of: an audio output transducer; a haptic output transducer; a piezoelectric transducer; and a ceramic transducer.

15. An electronic device comprising the driver apparatus of claim 1.

16. A driver apparatus comprising:
a first switching output stage for switching a first driver output node between a set of switching voltages with a controlled duty cycle,
wherein the driver apparatus is operable in at least first and second modes of operation, wherein:
in the first mode of operation the set of switching voltages comprise a first voltage and a second voltage; and
in the second mode of operation the set of switching voltages comprise said second voltage and a third voltage;
the driver apparatus further comprising a controller for controlling the mode of operation of the driver apparatus and the duty cycle of the first switching output stage based on an input signal;
and wherein the controller is configured to transition between the first and second mode of operations from a present mode to a new mode by:
controlling the driver apparatus in the present mode with a first duty cycle;
controllably varying the set of switching voltages to the relevant voltages for the new mode of operation; and
controllably varying the duty cycle of the first switching output stage, wherein the change in duty cycle is controlled such that there is substantially no discontinuity in switching ripple.

17. A driver apparatus for driving a transducer comprising:
a first switching driver having a first driver output node for driving the transducer, wherein the first switching driver comprises a first output bridge stage for selectively switching the first driver output node between high and low switching voltages,
a first modulator for controlling a duty cycle of switching of the first output bridge stage based on an input signal; and
a first voltage controller for providing said switching voltages;
wherein the first switching driver is operable in a plurality of driver modes of operation in which the first voltage controller is operable to provide different switching voltages in each driver mode; and the apparatus comprises:
a controller for controlling the driver mode of operation and the duty cycle of the first switching driver based on the input signal, wherein the controller is configured to transition between said driver modes of operation from a present mode to a new mode by:
controlling the first voltage controller to provide the switching voltages for the new mode; and
controlling the first modulator to vary the duty cycle of the first output bridge stage, wherein the change in duty cycle is controlled such that there is no substantial discontinuity in switching ripple.

* * * * *